(12) United States Patent
Wei et al.

(10) Patent No.: US 11,177,797 B2
(45) Date of Patent: Nov. 16, 2021

(54) MEASURING DEVICE AND MEASURING METHOD

(71) Applicants: BEIJING BOE TECHNOLOGY DEVELOPMENT CO., LTD., Beijing (CN); BOE TECHNOLOGY GROUP CO., LTD., Beijing (CN)

(72) Inventors: Xiangye Wei, Beijing (CN); Liming Xiu, Beijing (CN)

(73) Assignees: BEIJING BOE TECHNOLOGY DEVELOPMENT CO., LTD., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 118 days.

(21) Appl. No.: 16/633,298

(22) PCT Filed: Jan. 2, 2019

(86) PCT No.: PCT/CN2019/070133
§ 371 (c)(1),
(2) Date: Jan. 23, 2020

(87) PCT Pub. No.: WO2020/140208
PCT Pub. Date: Jul. 9, 2020

(65) Prior Publication Data
US 2021/0226618 A1    Jul. 22, 2021

(51) Int. Cl.
*G01K 7/00* (2006.01)
*H03K 5/00* (2006.01)
(Continued)

(52) U.S. Cl.
CPC ......... *H03K 5/00006* (2013.01); *G01K 7/245* (2013.01); *H03K 3/037* (2013.01); *H03K 19/21* (2013.01); *H03L 7/06* (2013.01)

(58) Field of Classification Search
CPC .... H03K 5/00006; H03K 19/21; H03K 3/037; G01K 7/245; H03L 7/06
(Continued)

(56) References Cited

U.S. PATENT DOCUMENTS

| 4,267,514 A | 5/1981 | Kimsey |
| 7,877,222 B2 * | 1/2011 | Boerstler ............ H03L 7/0995 |
| | | 702/132 |

(Continued)

FOREIGN PATENT DOCUMENTS

| CN | 101820273 A | 9/2010 |
| CN | 106027043 A | 10/2016 |

(Continued)

*Primary Examiner* — Ryan Jager
(74) *Attorney, Agent, or Firm* — Dilworth & Barrese, LLP.; Michael J. Musella, Esq.

(57) ABSTRACT

A measuring device and a measuring method are provided. The measuring device includes an oscillating circuit, a time average frequency-frequency lock loop, and a digital signal processing circuit. The oscillation circuit includes an element to be measured and is configured to output a signal having an oscillation frequency correlated with an element value of the element to be measured. The time average frequency-frequency lock loop is configured to receive the signal output by the oscillation circuit and output a frequency control word correlated with the oscillation frequency. The digital signal processing circuit is configured to read the frequency control word output by the time average frequency-frequency lock loop and obtain the element value of the element to be measured according to the read frequency control word. The measuring device is easy to integrate, has small volume, low power consumption, and high reliability, and can achieve high-precision measurement.

20 Claims, 9 Drawing Sheets

(51) Int. Cl.
*H03K 3/037* (2006.01)
*G01K 7/24* (2006.01)
*H03K 19/21* (2006.01)
*H03L 7/06* (2006.01)

(58) Field of Classification Search
USPC .......................................................... 374/170
See application file for complete search history.

(56) References Cited

U.S. PATENT DOCUMENTS

| | | |
|---|---|---|
| 9,379,714 B1 * | 6/2016 | Xiu ........................ G01S 7/4865 |
| 9,590,642 B2 | 3/2017 | Haneda et al. |
| 9,621,173 B1 * | 4/2017 | Xiu ........................ H03L 7/0991 |
| 10,558,238 B2 * | 2/2020 | Xiu .......................... H03L 7/085 |
| 10,715,154 B2 * | 7/2020 | Xiu ............................ H03L 7/18 |
| 2009/0024349 A1 * | 1/2009 | Boerstler ................ H03L 1/022 |
| | | 702/132 |
| 2019/0123749 A1 | 4/2019 | Xiu |

FOREIGN PATENT DOCUMENTS

| | | |
|---|---|---|
| CN | 106788424 A | 5/2017 |
| CN | 108270437 A | 7/2018 |
| CN | 108270441 A | 7/2018 |

\* cited by examiner

MEASURING DEVICE AND MEASURING METHOD

TECHNICAL FIELD

Embodiments of the present disclosure relates to a measuring device and a measuring method.

BACKGROUND

In the era of Internet of Things, sensing technology is an interface between devices and nature, and is also an important foundation of machine intelligence. As a key element of the sensing technology, sensors are widely used in agriculture, industry, biology, scientific research, and other fields. Among various types of sensors, a temperature sensor is one of the most widely used sensors.

Common temperature sensing design methods include, for example, a metal expansion method, a bimetallic sheet method, a bimetallic rod and metal tube method, a liquid and gas deformation method, a resistance sensing method, a thermocouple method, etc. Most of these temperature sensing design methods are based on the deformation of matter, however the deformation is a physical quantity inconvenient to measure in electronic systems. Therefore, the temperature sensor designed by the methods based on the deformation of matter has limitations in design, use, transplantation, and other stages. Among these temperature sensing design methods, the thermocouple method is one of the most widely used temperature sensing design methods in industrial measurement. The thermocouple method measures a temperature by directly contacting a thermocouple with a measured object. Therefore, this thermocouple method is not affected by an intermediate medium and has a wide measurement range. However, at present, the thermocouple method has complex signal processing, and is susceptible to corrosion and has poor noise resistance. In addition, the resistance sensing method is based on a measurement of a resistance. However, because the resistance sensing method directly takes a value of the resistance as an output, it is difficult to measure and use the value of the resistance in an electronic system.

With a rapid development of Internet of Things technology, the requirements for temperature sensors are getting higher and higher. High precision, multi-function, high reliability, low power consumption and low cost are the development trends of sensors in the future.

SUMMARY

Embodiments of the present disclosure provide a measuring device. The measuring device includes: an oscillation circuit including an element to be measured and configured to output a signal having an oscillation frequency correlated with an element value of the element to be measured; a time average frequency-frequency lock loop (TAF-FLL) configured to receive the signal output by the oscillation circuit and output a frequency control word correlated with the oscillation frequency; and a digital signal processing circuit configured to read the frequency control word output by the time average frequency-frequency lock loop and obtain the element value of the element to be measured according to the frequency control word that is read.

For example, in the measuring device according to the embodiments of the present disclosure, the time average frequency-frequency lock loop includes a frequency detector, a controller, a frequency divider, and a digital voltage controlled oscillator. The frequency detector is configured to output a control signal to the controller according to an input signal and a feedback signal fed back by the frequency divider. The controller is configured to adjust the frequency control word according to the control signal and output an adjusted frequency control word to the digital voltage controlled oscillator. The frequency divider is configured to perform frequency division a received signal and feed a frequency-divided signal back to the frequency detector, where a frequency division ratio is N, and N is a real number greater than or equal to 1. The digital voltage controlled oscillator is configured to output a signal having a frequency correlated with the frequency control word that is receive to the frequency divider based on time-average-frequency direct period synthesis (TAF-DPS), and output the frequency control word, which is received by the digital voltage controlled oscillator when the time average frequency-frequency lock loop is in a locked state.

For example, in the measuring device according to the embodiments of the present disclosure, the frequency detector is configured to determine a magnitude relationship between an input frequency of the input signal and a feedback frequency of the feedback signal to obtain the control signal, where the control signal includes a first sub-control signal and a second sub-control signal, the frequency detector is configured to generate and output the first sub-control signal when the input frequency is greater than the feedback frequency, and the frequency detector is configured to generate and output the second sub-control signal when the input frequency is less than the feedback frequency.

For example, in the measuring device according to embodiments of the present disclosure, the controller is configured to, according to the first sub-control signal, subtract a first adjustment parameter from a current frequency control word to generate the adjusted frequency control word; or the controller is configured to, according to the second sub-control signal, add a second adjustment parameter to the current frequency control word to generate the adjusted frequency control word.

For example, in the measuring device according to embodiments of the present disclosure, both the first adjustment parameter and the second adjustment parameter are 1.

For example, in the measuring device according to embodiments of the present disclosure, the frequency detector includes a first circuit, a second circuit, and a third frequency division circuit, one feedback period of the feedback signal includes a first edge, a second edge, and a third edge, and the second edge is between the first edge and the third edge. The third frequency division circuit is configured to receive the input signal and perform frequency division the input signal to obtain a first intermediate signal having a first intermediate frequency, a third frequency division coefficient of the third frequency division circuit is 2. The first circuit is configured to determine and output a first logic value of the first edge, a second logic value of the second edge, and a third logic value of the third edge. The second circuit is configured to generate and output the first sub-control signal or the second sub-control signal according to the first logic value, the second logic value, and the third logic value.

For example, in the measuring device according to embodiments of the present disclosure, the first circuit includes a first D flip-flop, a second D flip-flop, a third D flip-flop, a fourth D flip-flop and a first NOT gate, and the second circuit includes a first XOR gate, a second XOR gate, a second NOT gate, a third NOT gate, a first AND gate, and a second AND gate. A data input terminal of the first D flip-flop is configured to receive the first intermediate signal, a clock input terminal of the first D flip-flop is configured to receive the feedback signal, an output terminal of the first D flip-flop is connected to a data input terminal of the second D flip-flop and a first data input terminal of the first XOR gate, and the output terminal of the first D flip-flop is configured to output the first logic value. A clock input terminal of the second D flip-flop is configured to receive the feedback signal, an output terminal of the second D flip-flop is connected to a first data input terminal of the second XOR gate, and the output terminal of the second D flip-flop is configured to output the third logic value. The first NOT gate is configured to receive the feedback signal and invert the feedback signal to obtain an intermediate feedback signal. A data input terminal of the third D flip-flop is configured to receive the first intermediate signal, a clock input terminal of the third D flip-flop is configured to receive the intermediate feedback signal, and an output terminal of the third D flip-flop is connected to a data input terminal of the fourth D flip-flop. A clock input terminal of the fourth D flip-flop is configured to receive the feedback signal, an output terminal of the fourth D flip-flop is connected to a second data input terminal of the first XOR gate and a second data input terminal of the second XOR gate, and the output terminal of the fourth D flip-flop is configured to output the second logic value. An output terminal of the first XOR gate is connected to an input terminal of the second NOT gate and a first data input terminal of the first AND gate. An output terminal of the second XOR gate is connected to an input terminal of the third NOT gate and a second data input terminal of the first AND gate. An output terminal of the second NOT gate is connected to a first data input terminal of the second AND gate, and an output terminal of the third NOT gate is connected to a second data input terminal of the second AND gate. An output terminal of the first AND gate is configured to output the first sub-control signal, and an output terminal of the second AND gate is configured to output the second sub-control signal.

For example, in the measuring device according to embodiments of the present disclosure, the digital voltage controlled oscillator includes a time-average-frequency direct period synthesis frequency synthesizer. The time-average-frequency direct period synthesis frequency synthesizer is configured to generate a first period and a second period according to a base time unit and an input frequency control word that is received and generate a clock signal in an interleaved manner by using the first period and the second period. The base time unit is a phase difference between any two adjacent signals of two or more signals with phases evenly spaced, and the clock signal that is generated is represented by an equation of:

$$T_{TAF} = (1-r)*T_A + r*T_B,$$

where $T_{TAF}$ is a period of the clock signal that is generated, $T_A$ is the first period, $T_B$ is the second period, and r is a number that controls an occurrence probability of the first period and an occurrence probability of the second period, and $0 \le r < 1$.

For example, in the measuring device according to embodiments of the present disclosure, a relationship between the frequency control word output by the digital voltage controlled oscillator and a frequency of an oscillation signal output by the oscillation circuit satisfies an equation of:

$$f_i = \frac{f_\Delta}{N \cdot FREQ},$$

where $f_\Delta$ is a reciprocal of the base time unit of the digital voltage controlled oscillator, FREQ is the frequency control word output by the digital voltage controlled oscillator, N is the frequency division ratio of the frequency divider, and $f_i$ is the frequency of the oscillation signal output by the oscillation circuit.

For example, in the measuring device according to embodiments of the present disclosure, the time average frequency-frequency lock loop is a fully digital frequency lock loop.

For example, in the measuring device according to embodiments of the present disclosure, the element to be measured is a variable resistor, and the digital signal processing circuit is configured to obtain a resistance value of the variable resistor according to the frequency control word that is read.

For example, in the measuring device according to embodiments of the present disclosure, the oscillation circuit is an RC oscillation circuit, and a relationship between the resistance value of the variable resistor and the frequency control word read by the digital signal processing circuit satisfies an equation of:

$$R = \frac{N \cdot FREQ}{2\pi C f_\Delta},$$

where $f_\Delta$ is a reciprocal of a base time unit of a digital voltage controlled oscillator in the time average frequency-frequency lock loop, N is a frequency division ratio of the frequency divider in the time average frequency-frequency lock loop, FREQ is the frequency control word read by the digital signal processing circuit, R is the resistance value of the variable resistor, and C is a capacitance value of a capacitor in the RC oscillation circuit.

For example, in the measuring device according to embodiments of the present disclosure, the variable resistor is a thermistor, and the digital signal processing circuit is configured to obtain an ambient temperature of an environment at which the thermistor is located according to the frequency control word that is read.

For example, in the measuring device according to embodiments of the present disclosure, the thermistor is a positive temperature coefficient thermistor.

For example, in the measuring device according to embodiments of the present disclosure, the oscillation circuit is an RC oscillation circuit, and the thermistor is a negative temperature coefficient thermistor, and a relationship between the ambient temperature of the environment at which the thermistor is located and the frequency control word read by the digital signal processing circuit satisfies an equation of:

$$T = \frac{\ln(k \cdot FREQ/R_0)}{B} + \frac{1}{T_0},$$

where $$k = \frac{N}{2\pi C f_\Delta},$$

T is the ambient temperature of the environment at which the thermistor is located, $f_A$ is the reciprocal of the base time unit of the digital voltage controlled oscillator in the time average frequency-frequency lock loop, N is the frequency division ratio of the frequency divider in the time average frequency-frequency lock loop, FREQ is the frequency control word read by the digital signal processing circuit, R is the resistance value of the thermistor, B is a sensitivity index of the thermistor, $T_0$ is an initial temperature, and $R_0$ is an initial resistance value of the thermistor.

For example, in the measuring device according to embodiments of the present disclosure, the element to be measured is a variable capacitor, and the digital signal processing circuit is configured to obtain a capacitance value of the variable capacitor according to the frequency control word that is read.

For example, in the measuring device according to embodiments of the present disclosure, the element to be measured is a variable inductor, and the digital signal processing circuit is configured to obtain an inductance value of the variable inductor according to the frequency control word that is read.

For example, in the measuring device according to embodiments of the present disclosure, the time average frequency-frequency lock loop and the digital signal processing circuit are arranged in a same chip.

Embodiments of the present disclosure provide a measuring method. The measuring method includes: causing an oscillation circuit to output a signal having an oscillation frequency correlated with an element value of an element to be measured; receiving, by a time average frequency-frequency lock loop, the signal output by the oscillation circuit, and outputting a frequency control word correlated with the oscillation frequency; reading, by a digital signal processing circuit, the frequency control word output by the time average frequency-frequency lock loop, and obtaining the element value of the element to be measured according to the frequency control word output by the time average frequency-frequency lock loop.

For example, in the measuring method according to embodiments of the present disclosure, the element to be measured is a variable resistor, and the measuring method includes obtaining a resistance value of the variable resistor according to the frequency control word that is read.

For example, in the measuring method according to embodiments of the present disclosure, the variable resistor is a thermistor, and the measuring method further includes: obtaining, by the digital signal processing circuit, an ambient temperature of an environment at which the thermistor is located according to the frequency control word that is read.

For example, in the measuring method according to embodiments of the present disclosure, the element to be measured is a variable capacitor, and the measuring method includes obtaining a capacitance value of the variable capacitor according to the frequency control word that is read.

For example, in the measuring method according to embodiments of the present disclosure, the element to be measured is a variable inductor, and the measuring method includes obtaining an inductance value of the variable inductor according to the frequency control word that is read.

BRIEF DESCRIPTION OF THE DRAWINGS

In order to more clearly explain the technical solution of the embodiments of the present disclosure, the accompanying drawings of the embodiments will be briefly introduced below. Apparently, the accompanying drawings described below only refer to some embodiments of the present disclosure, and are not limitations of the present disclosure.

DETAILED DESCRIPTION

Figure 1:
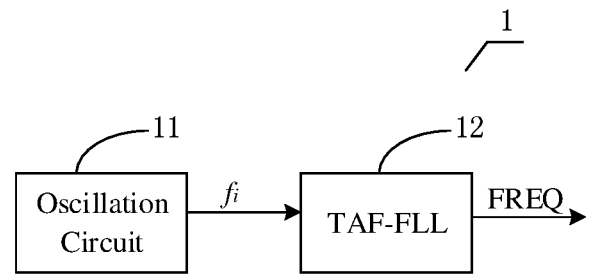
FIG. 1 shows a schematic structural diagram of a measuring device according to an exemplary embodiment of the present disclosure.

In order to make objects, technical details and advantages of the embodiments of the disclosure apparent, the technical solutions of the embodiments will be described in a clearly and fully understandable way in connection with the drawings related to the embodiments of the present disclosure. Apparently, the described embodiments are just a part but not all of the embodiments of the present disclosure. Based on the described embodiments herein, those skilled in the art can obtain other embodiment(s), without any inventive work, which should be within the scope of the present disclosure.

Terms used herein to describe the embodiments of the present disclosure is not intend to limit and/or define the scope of the present disclosure.

For example, unless otherwise defined, technical terms or scientific terms used in the present disclosure shall have the usual meanings as understood by those of ordinary skill in the field to which the present disclosure belongs.

It should be understood that the terms "first", "second", and the like, which are used in the present disclosure, are not intended to indicate any sequence, amount, or importance, but rather are used to distinguish various components. Unless the context clearly indicates otherwise, similar words such as the singular forms "a", "an", or "the" do not denote a limitation on quantity, but rather denote the presence of at least one.

It would be further understood that the terms "include" or "comprise" and the like mean that the elements or objects stated before these terms encompass the elements or objects and their equivalents listed after these terms, and do not preclude other elements or objects. Similar phrases "connect", "connected", etc., are not intended to define a physical connection or mechanical connection, but may include electrical connections, whether directly or indirectly. "Up", "down", "left" and "right" are only used to indicate the relative positional relationship. When the absolute position of the described object changes, the relative positional relationship may also change accordingly.

Hereinafter, exemplary embodiments of the present disclosure will be described in detail with reference to the accompanying drawings. In the accompanying drawings, the same reference numerals or numbers may refer to components or elements that perform substantially the same function.

According to at least one exemplary embodiment of the present disclosure, a measuring device is provided. The measuring device includes: an oscillation circuit including an element to be measured, the oscillation circuit being configured to output a signal having an oscillation frequency correlated with an element value of the element to be measured; a time average frequency-frequency lock loop (TAF-FLL) configured to receive the signal output by the oscillation circuit and output a frequency control word correlated with the oscillation frequency; and a digital signal processing circuit configured to read the frequency control word output by the TAF-FLL and obtain the element value of the element to be measured according to the frequency control word that is read.

According to at least one exemplary embodiment of the present disclosure, a measuring method is provided. The measuring method includes: causing an oscillation circuit to output a signal having an oscillation frequency correlated with an element value of an element to be measured; receiving, by a TAF-FLL, the signal output by the oscillation circuit, and outputting a frequency control word correlated with the oscillation frequency; reading, by a digital signal processing circuit, the frequency control word output by the TAF-FLL, and obtaining the element value of the element to be measured according to the frequency control word output by the TAF-FLL.

FIG. 1 shows a schematic structural diagram of a measuring device according to an exemplary embodiment of the present disclosure. Referring to FIG. 1, the measuring device 1 according to an exemplary embodiment of the present disclosure includes an oscillation circuit 11 and a time average frequency-frequency lock loop (TAF-FLL) 12. For example, the oscillation circuit 11 includes an element to be measured and is configured to output a signal having an oscillation frequency f correlated with an element value of the element to be measured. The TAF-FLL 12 is configured to receive the signal output by the oscillation circuit and output a frequency control word FREQ correlated with the oscillation frequency f. Because the frequency control word FREQ output by the TAF-FLL 12 is correlated with the oscillation frequency f of the output signal of the oscillation circuit 11, and the frequency of the output signal of the oscillation circuit 11 is correlated with the element value of the element to be measured, the element value of the element to be measured or other parameters correlated with the element value of the element to be measured can be represented by the frequency control word FREQ. For example, the element to be measured may be one of a group consisting of a resistor, a capacitor, and an inductor.

Figure 2:
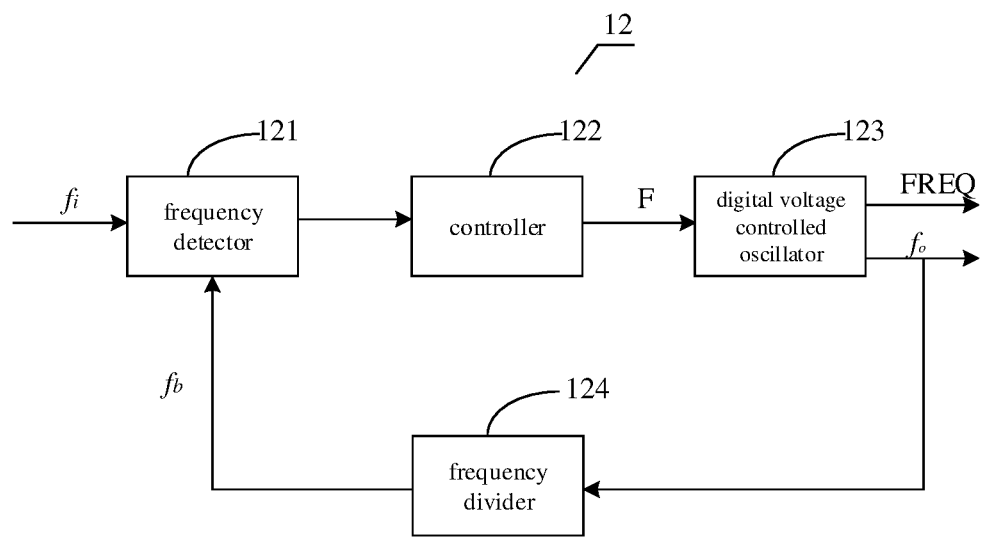
FIG. 2 shows a schematic structural diagram of a TAF-FLL according to an exemplary embodiment of the present disclosure.

FIG. 2 is a schematic structural diagram of a TAF-FLL according to an exemplary embodiment of the present disclosure. Referring to FIG. 2, the TAF-FLL 12 may include a frequency detector 121, a controller 122, a frequency divider 124, and a digital voltage controlled oscillator 123. In the TAF-FLL 12, the frequency detector 121, the controller 122, the digital voltage controlled oscillator 123, and the frequency divider 124 are connected in series to form a loop.

The frequency detector 121 may be configured to output a control signal to the controller 122 according to a signal fed back by the frequency divider 124 and an input signal. Specifically, the frequency detector 121 may compare the input signal with the signal fed back by the frequency divider 124, and output the control signal to the controller 122 according to a comparison result.

As an example, the frequency detector 121 may be configured to determine which of the input signal and the signal fed back by the frequency divider 124 has a faster (or slower) frequency, and send the control signal to the controller 122 according to the result of the determination. For example, the frequency detector 121 may be configured to generate and output a first sub-control signal in a case where the input frequency $f_i$ is greater than the feedback frequency $f_b$, and generate and output a second sub-control signal in a case where the input frequency $f_i$ is less than the feedback frequency $f_b$.

In one example, the first sub-control signal is valid when the first sub-control signal is at a first level, and is invalid when the first sub-control signal is at a second level. Similarly, the second sub-control signal is valid when the second sub-control signal is at the first level, and is invalid when the second sub-control signal is at the second level. It should be noted that in the present disclosure, the first level may represent a high level and the second level may represent a low level, but embodiments of the present disclosure are not limited thereto. The first level may represent a low level, and accordingly, the second level may represent a high level. The setting of the first level and the second level may be determined depending on specific actual conditions, and the embodiments of the present disclosure are not limited thereto. The embodiments of the present disclosure will be described by taking a case that the first level represents a high level and the second level represents a low level as an example. The following embodiments are the same as this case, and similar description will not be described again.

For example, in a case where the input frequency $f_i$ is greater than the feedback frequency $f_b$, the frequency detector 121 is configured to generate and output the first sub-control signal at the first level and the second sub-control signal at the second level. In a case where the input frequency $f_i$ is smaller than the feedback frequency $f_b$, the frequency detector 121 is configured to generate and output the second sub-control signal at the first level and the first sub-control signal at the second level. In a case where the input frequency $f_i$ is equal to the feedback frequency $f_b$, the frequency detector 121 is configured to generate and output the first sub-control signal at the second level and the second sub-control signal at the second level. That is, in a case where the input frequency $f_i$ is greater than the feedback frequency $f_b$, the first sub-control signal is valid and the second sub-control signal is invalid; in a case where the input frequency $f_i$ is less than the feedback frequency $f_b$, the second sub-control signal is valid and the first sub-control signal is invalid; and in a case where the input frequency $f_i$ is equal to the feedback frequency $f_b$, neither the first sub-control signal nor the second sub-control signal is valid. It should be noted that in a case where the input frequency $f_i$ is greater than the feedback frequency $f_b$, the frequency detector 121 may also generate and output only the first sub-control signal at the first level. In a case where the input frequency $f_i$ is less than the feedback frequency $f_b$, the frequency detector 121 may also generate and output only the second sub-control signal at the first level. In a case where the input frequency $f_i$ is equal to the feedback frequency $f_b$, the frequency detector 121 does not output a signal. It can be seen that the frequency detector according to the embodiment of the present disclosure can indicate a magnitude relationship between the input frequency $f_i$ and the feedback frequency $f_b$ by outputting the first sub-control signal or the second sub-control signal. A circuit principle of the frequency detector 121 according to an exemplary embodiment of the present disclosure will be described later with reference to the accompanying drawings.

The controller 122 may be configured to adjust the frequency control word according to the control signal, and output the adjusted frequency control word to the digital voltage controlled oscillator 123. Specifically, the controller 122 receives the control signal from the frequency detector 121, adjusts the frequency control word according to the control signal, and transmits the adjusted frequency control word to the digital voltage controlled oscillator 123.

For example, the controller 122 may be configured to, according to the first sub-control signal received from the frequency detector 121, subtract a first adjustment parameter from the current frequency control word to generate the adjusted frequency control word. Alternatively, the controller 122 may be configured to, according to the second sub-control signal received from the frequency detector 121, add the current frequency control word to a second adjustment parameter to generate the adjusted frequency control word.

For example, before the frequency control word is adjusted (for example, before the TAF-FLL is put into use), the current frequency control word can be randomly set or set according to actual requirements. In the subsequent adjustment process, the current frequency control word is a frequency control word obtained in the adjacent previous adjustment process. That is, for example, in a first adjustment process, the controller 122 adjusts an initial current frequency control word according to the control signal to obtain, for example, a first frequency control word, the first frequency control word is output to the digital voltage controlled oscillator 123, and meanwhile, the first frequency control word may also be stored in the controller 122 and serves as the current frequency control word in, for example, a second adjustment process, and in the second adjustment process, the controller 122 adjusts the first frequency control word according to the control signal to obtain, for example, a second frequency control word, the second frequency control word is output to the digital voltage controlled oscillator 123, and meanwhile the second frequency control word may also be stored in the controller 122 and serves as the current frequency control word in, for example, a third adjustment process, and so on. An exemplary structure of the controller 122 will be described later with reference to the accompanying drawings.

The frequency divider 124 may be configured to perform frequency division on the received frequency signal and feed a frequency-divided signal back to the frequency detector 121, a frequency division ratio is N, and N is a real number greater than or equal to 1.

The digital voltage controlled oscillator 123 may be configured to output a signal having a frequency correlated with the received frequency control word to the frequency divider 124 based on the time average frequency-direct period synthesis (TAF-DPS), and output the frequency control word, which is received by the digital voltage controlled oscillator 123 when the TAF-FLL 12 is in a lock state. A relationship between the frequency of the signal output from the digital voltage controlled oscillator 123 to the frequency divider 124 and the feedback frequency of the feedback signal output by the frequency divider 124 satisfies an equation of:

$$f_b = \frac{f_o}{N}.$$

In the above equation, $f_b$ is the feedback frequency of the feedback signal output by the frequency divider 124, $f_o$ is the frequency of the signal output from the digital voltage controlled oscillator 123 to the frequency divider, N is the frequency division ratio of the frequency divider 124, and N is a real number greater than or equal to 1.

In a case where the TAF-FLL 12 is in the lock state, the feedback frequency of the feedback signal output by the frequency divider 124 is equal to the input frequency of the input signal of the frequency detector 121. Accordingly, in a case where the TAF-FLL 12 is in the lock state, a relationship between the frequency of the signal output from the digital voltage controlled oscillator 123 to the frequency divider 124 and the input frequency of the input signal of the frequency detector 121 satisfies an equation of:

$$f_i = f_b = \frac{f_o}{N}.$$

In the above equation, $f_i$ is the input frequency of the input signal of the frequency detector 121.

For example, the frequency detector 121, the controller 122, the frequency divider 124, and the digital voltage controlled oscillator 123 in some exemplary embodiments of the present disclosure are all digital devices. That is, the TAF-FLL in the exemplary embodiment of the present disclosure may be a digital FLL, for ease of implementation.

An exemplary structure of the TAF-FLL implemented based on the TAF-DPS will be described below.

For example, the digital voltage controlled oscillator 123 according to an exemplary embodiment of the present disclosure may include a TAF-DPS frequency synthesizer 1231. The operation principle of the TAF-DPS frequency synthesizer 1231 according to an exemplary embodiment of the present disclosure will be described below with reference to FIG. 3.

Figure 3:
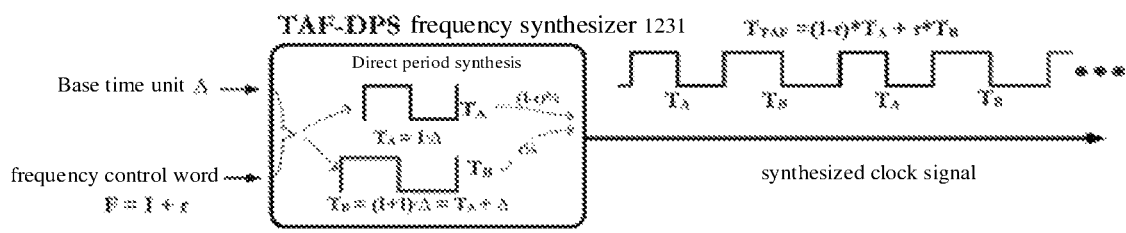
FIG. 3 shows a schematic diagram of a principle of TAF-DPS according to an exemplary embodiment of the present disclosure.
Figure 4:
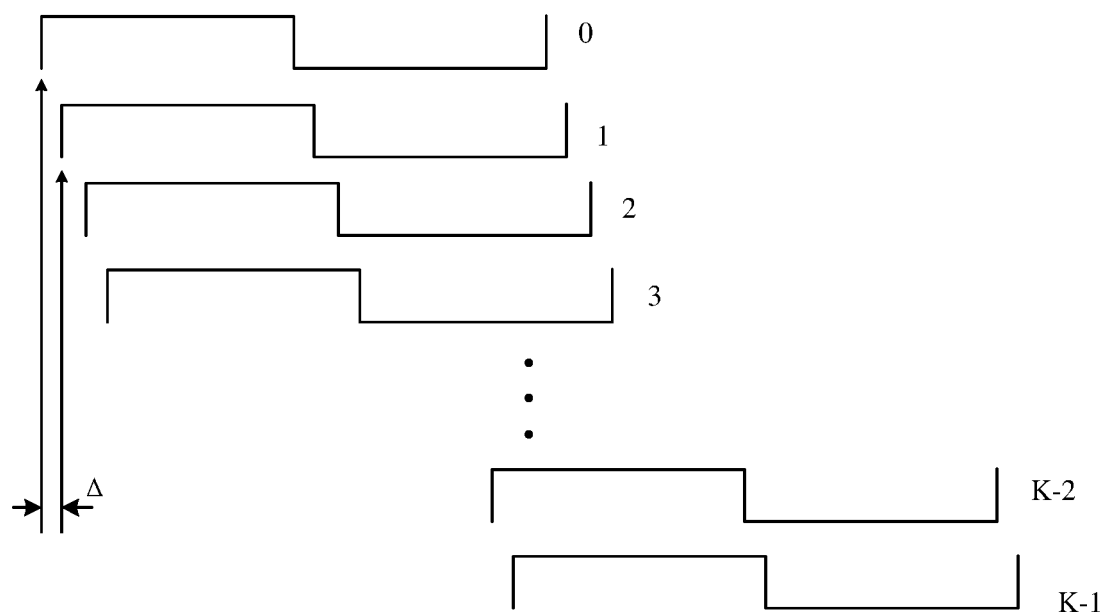
FIG. 4 shows a schematic diagram of K signals with phases evenly spaced according to an exemplary embodiment of the present disclosure.
Figure 5:
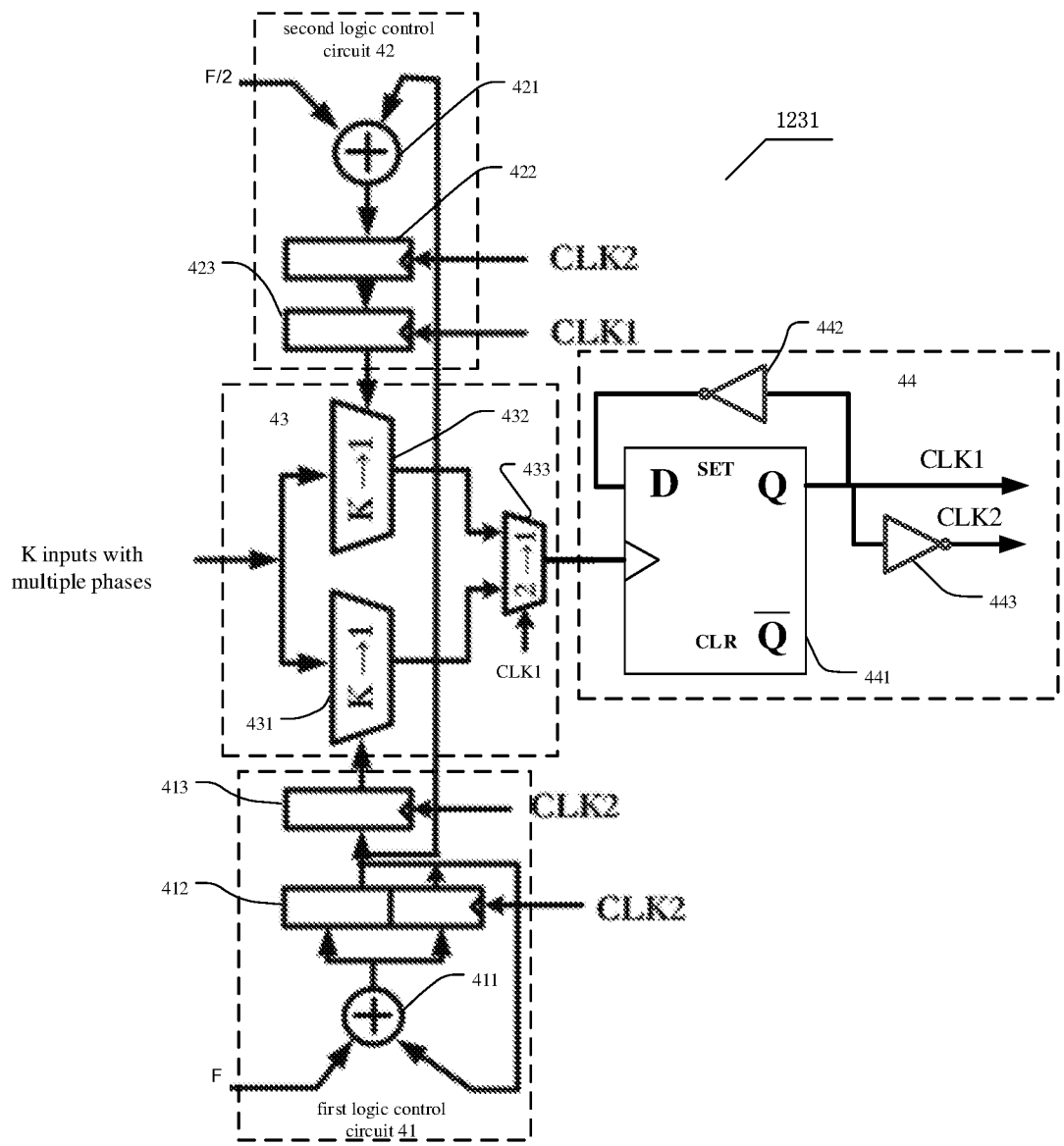
FIG. 5 shows an exemplary circuit implementation block diagram of a TAF-DPS frequency synthesizer according to an exemplary embodiment of the present disclosure.

FIG. 3 shows a schematic principle diagram of the TAF-DPS frequency synthesizer 1231 according to an exemplary embodiment of the present disclosure. FIG. 4 shows a schematic diagram of K signals with phases evenly spaced according to an exemplary embodiment of the present disclosure. FIG. 5 shows an exemplary circuit implementation block diagram of the TAF-DPS frequency synthesizer according to an exemplary embodiment of the present disclosure.

Referring to FIG. 3, the TAF-DPS frequency synthesizer 1231 may be configured to generate a first period and a second period according to a base time unit Δ and an input frequency control word F that is received, and to generate a clock signal in an interleaved manner by using the first period and the second period.

The TAF-DPS frequency synthesizer 1231 receives the K (K is an integer greater than 1) signals with phases evenly spaced and the frequency control word F=I+r, where I is an integer part, r is a fractional part (i.e., a decimal part), and 0≤r<1. The base time unit Δ is a phase difference between any two adjacent signals among the K signals with phases evenly spaced. The TAF-DPS frequency synthesizer 1231 has an output terminal for outputting a synthesized clock signal. The synthesized clock signal is a synthesized time average frequency clock signal. According to the received base time unit Δ and the frequency/period control word, the TAF-DPS frequency synthesizer 1231 generates two types of periods, the first period $T_A$=I*Δ, and the second period $T_B$=(I+1)*Δ. The output clock signal of the TAF-DPS frequency synthesizer 1231 is a clock pulse train generated in an interleaving manner by using two types of periods $T_A$ and $T_B$, and a period of the output clock pulse train is $T_{TAF}$=(1−r)*$T_A$+r*$T_B$=F*Δ. The occurrence probability of the first period $T_A$ and the occurrence probability of the second period $T_B$ are controlled by the value of the fraction r. The frequency control word F is usually input by a user according to the frequency requirement. The base time unit Δ is usually designed according to the needs of circuit design. Given sufficient resources (i.e., a sufficient number of bits of r in the frequency control word F), the TAF-DPS frequency synthesizer 1231 can generate any frequency (arbitrary frequency generation). In addition, because each individual pulse is directly formed, the output frequency can be changed immediately, i.e., can be switched quickly.

A design method of the base time unit is briefly described below. The TAF-DPS frequency synthesizer receives the K signals with phases evenly spaced. For example, the K signals with phases evenly spaced can be generated by a Johnson Counter. Referring to FIG. 4, the base time unit Δ is a phase difference between any two adjacent such signals, the frequency of the K signals is $f_{div}$, and the K signals are evenly distributed in the period corresponding to the frequency $f_{div}$, and the value of the base time unit Δ can be calculated as: Δ=$T_{div}$/K=1/(K·$f_{div}$). $f_{div}$ is the frequency of the K signals, and K is an integer greater than 1.

FIG. 5 is a block diagram of an exemplary circuit implementation of the TAF-DPS frequency synthesizer as shown in FIG. 3. Referring to FIG. 5, the TAF-DPS frequency synthesizer may include a first input module, a second input module 43, and an output module 44. The first input module includes a first logic control circuit 41 and a second logic control circuit 42.

For example, referring to FIG. 5, the first input module includes a first logic control circuit 41 and a second logic control circuit 42. The first logic control circuit 41 includes a first adder 411, a first register 412, and a second register 413. The second logic control circuit 42 includes a second adder 421, a third register 422, and a fourth register 423.

For example, referring to FIG. 5, the second input module 43 includes a first K→1 multiplexer 431, a second K→1 multiplexer 432, and a 2→1 multiplexer 433. Each of the first K→1 multiplexer 431 and the second K→1 multiplexer 432 includes a plurality of input terminals for receiving the K (K is an integer greater than 1) signals with evenly spaced phases, a control input terminal, and an output terminal. The 2→1 multiplexer 433 includes a control input terminal, an output terminal, a first input terminal for receiving an output of the first K→1 multiplexer 431, and a second input terminal for receiving an output of the second K→1 multiplexer 432.

For example, referring to FIG. 5, the output module 44 includes a trigger circuit. The trigger circuit is used to generate a pulse train. The trigger circuit includes a D flip-flop 441, a first inverter 442, and a second inverter 443. The D flip-flop 441 includes a data input terminal, a clock input terminal for receiving an output from the output terminal of the 2→1 multiplexer 433, and an output terminal for outputting a first clock signal CLK1. The first inverter 442 includes an input terminal for receiving the first clock signal CLK1 and an output terminal for outputting a signal to the data input terminal of the D flip-flop 441. The second inverter 443 includes an input terminal for receiving the first clock signal CLK1 and an output terminal for outputting a second clock signal CLK2. The output terminal of the trigger circuit or the output terminal of the second inverter 443 can be used as the output terminal of the TAF-DPS frequency synthesizer.

For example, referring to FIG. 5, the first clock signal CLK1 is connected to the control input terminal of the 2→1 multiplexer 433, and the output terminal of the first inverter 442 is connected to the data input terminal of the D flip-flop 441.

For example, the first adder 411 may add the frequency control word F and the most significant bits (for example, 5 bits) stored in the first register 412, and then store the result of the addition in the first register 412 at a rising edge of the second clock signal CLK2; alternatively, the first adder 411 may add the frequency control word F and all information stored in the first register 412, and then store the result of the addition in the first register 412 at the rising edge of the second clock signal CLK2. At a rising edge of a next second clock signal CLK2, the most significant bit stored in the first register 412 is stored in the second register 413 and is used as a selection signal of the first K→1 multiplexer 431 for selecting one of the K input signals with multiple phases as a first output signal of the first K→1 multiplexer 431.

For example, the second adder 421 may add the frequency control word F/2 and the most significant bit stored in the first register 412, and then store the result of the addition in the third register 422 at the rising edge of the second clock signal CLK2. At a rising edge of a next first clock signal CLK1, the information stored in the third register 422 will be stored in the fourth register 423 and used as a selection signal of the second K→1 multiplexer 423 for selecting one of the K input signals with multiple phases as a second output signal of the second K→1 multiplexer 423.

For example, at a rising edge of the first clock signal CLK1, the 2→1 multiplexer 433 may select one of the first output signal output from the first K→1 multiplexer 431 and the second output signal output from the second K→1 multiplexer 432 as the output signal of the 2→1 multiplexer 433, and the output signal of the 2→1 multiplexer 433 serves as the input clock signal of the D flip-flop 441.

According to the principle of the TAF-DPS frequency synthesizer 1231 described above, the relationship between the frequency of the output signal of the TAF-DPS frequency synthesizer 1231 and the input frequency control word can be expressed by an equation of:

$$f_o = \frac{1}{T_{TAF}} = \frac{f_\Delta}{F}.$$

In the above equation, $f_o$ is the frequency of the output signal of the TAF-DPS frequency synthesizer 1231, F is the frequency control word input to the TAF-DPS frequency synthesizer 1231, and $f_\Delta$ is a reciprocal of the base time unit Δ in the TAF-DPS frequency synthesizer 1231. The frequency control word FREQ output by the TAF-FLL 12 (i.e., the frequency control word output by the digital voltage controlled oscillator 123) is a frequency control word F input to the TAF-DPS frequency synthesizer 1231 when the TAF-FLL 12 is in the lock state. Therefore, the frequency control word FREQ output by the TAF-FLL 12 and the frequency of the output signal of the TAF-FLL 12 can be expressed by an equation of:

$$f_o = \frac{f_\Delta}{FREQ}.$$

According to the previous description, the relationship between the frequency of the signal output from the digital voltage controlled oscillator 123 to the frequency divider 124 when the TAF-FLL 12 is in the lock state and the frequency of the input signal of the frequency detector 121 satisfies an equation of:

$$f_i = \frac{f_o}{N}.$$

By combining the relationship between the frequency of the signal output from the digital voltage controlled oscillator 123 to the frequency divider 124 and the output frequency control word, and the relationship between the frequency of the signal output from the digital voltage controlled oscillator 123 to the frequency divider 124 and the frequency of the input signal of the frequency detector 121, the relationship between the frequency control word FREQ output by the TAF-FLL 12 and the frequency of the input signal of the TAF-FLL 12 in the exemplary embodiment of the present disclosure can be obtained as:

$$f_i = \frac{f_\Delta}{N \cdot FREQ}.$$

An exemplary structure of the frequency detector 121 in the TAF-FLL 12 according to an exemplary embodiment of the present disclosure will be described below, and the operation mode of the exemplary structure is extended from the principle of Bang-Bang frequency detector.

Figure 6:
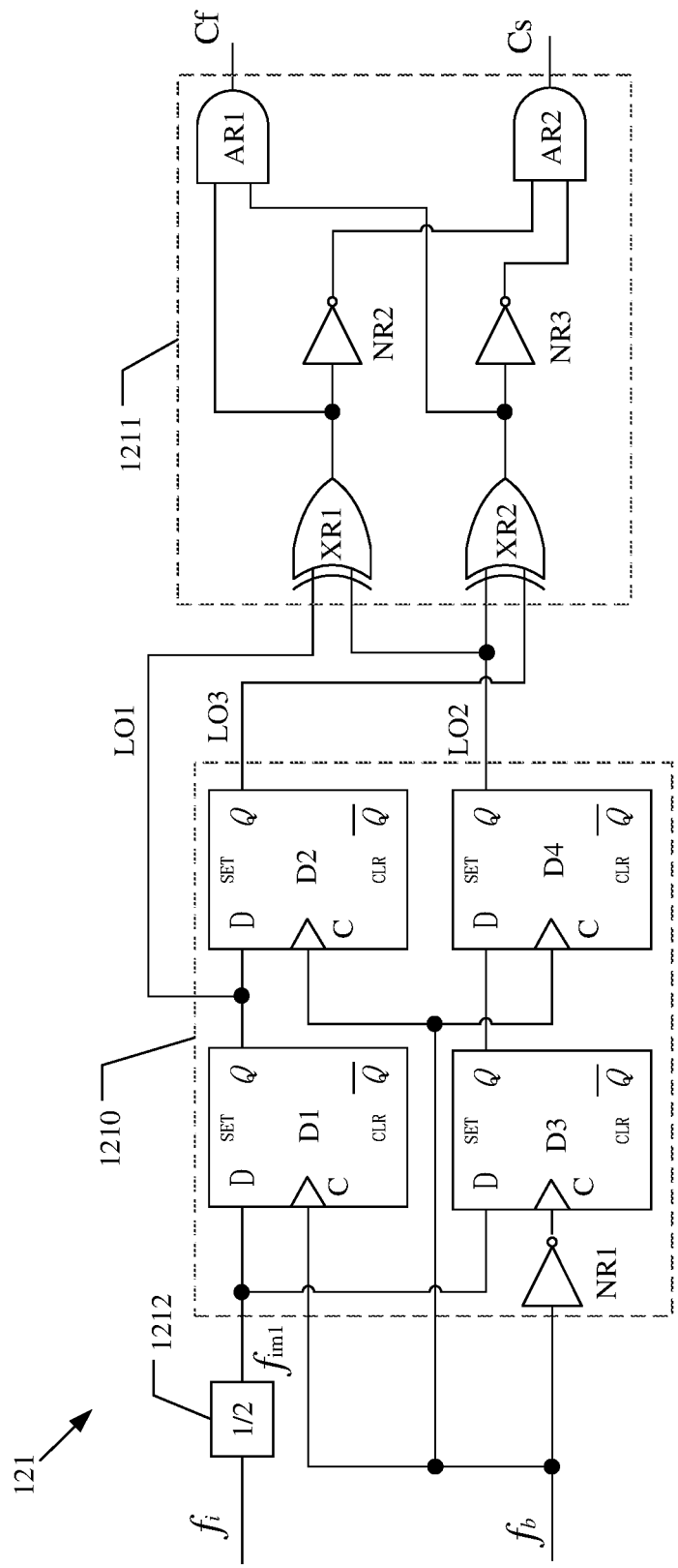
FIG. 6 shows an exemplary circuit implementation block diagram of a frequency detector according to an exemplary embodiment of the present disclosure.
Figure 7A:
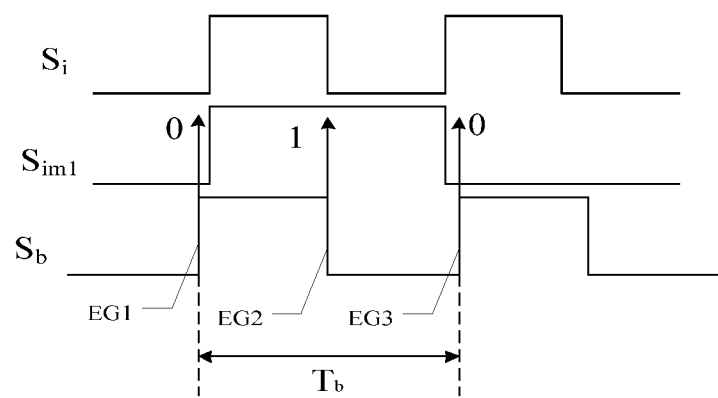
FIG. 7A shows a timing diagram when a frequency detector generates a first sub-control signal according to an exemplary embodiment of the present disclosure.
Figure 7B:
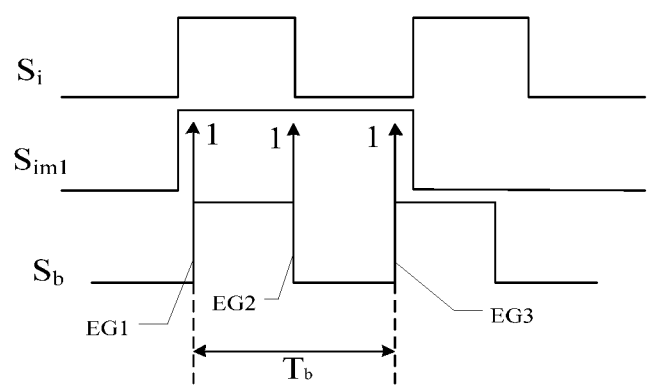
FIG. 7B shows another timing diagram when a frequency detector generates a first sub-control signal according to an exemplary embodiment of the present disclosure.
Figure 7C:
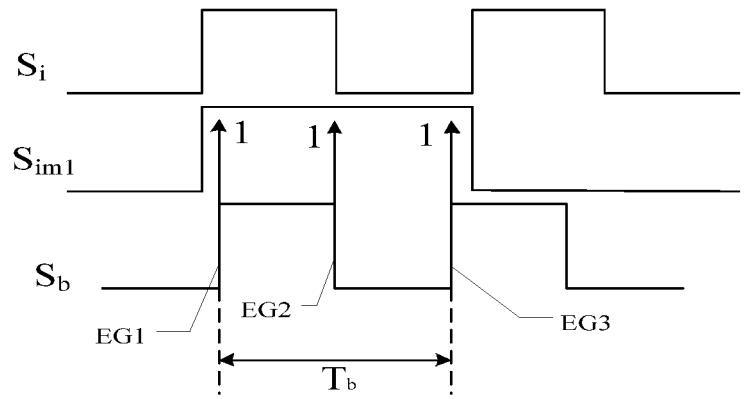
FIG. 7C shows a timing diagram when a frequency detector generates a second sub-control signal according to an exemplary embodiment of the present disclosure.
Figure 7D:
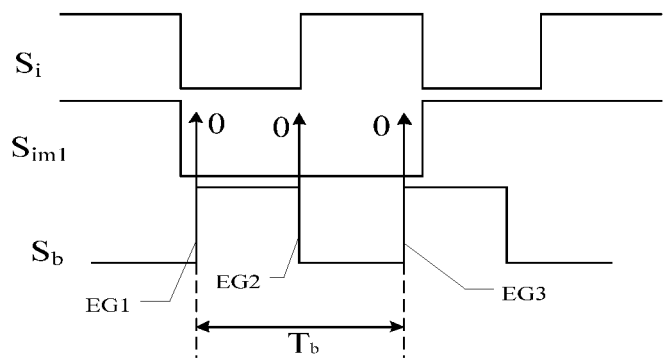
FIG. 7D shows another timing diagram when a frequency detector generates a second sub-control signal according to an exemplary embodiment of the present disclosure.

FIG. 6 shows a circuit implementation block diagram of a frequency detector according to an exemplary embodiment of the present disclosure. FIG. 7A shows a timing diagram when the frequency detector generates a first sub-control signal according to an exemplary embodiment of the present disclosure. FIG. 7B shows another timing diagram when the frequency detector generates the first sub-control signal according to an exemplary embodiment of the present disclosure. FIG. 7C shows a timing diagram when the frequency detector generates a second sub-control signal according to an exemplary embodiment of the present disclosure. FIG. 7D shows another timing diagram when the frequency detector generates the second sub-control signal according to an exemplary embodiment of the present disclosure.

For example, as shown in FIG. 6, the frequency detector 121 may include a first circuit 1210, a second circuit 1211, and a third frequency division circuit 1212.

For example, as shown in FIGS. 7A to 7D, one feedback period $T_b$ of the feedback signal $S_b$ having the feedback frequency $f_b$ may include a first edge EG1, a second edge EG2, and a third edge EG3, and the second edge EG2 is between the first edge EG1 and the third edge EG3. In an example as shown in FIGS. 7A and 7B, the first edge EG1 and the third edge EG3 are both rising edges, i.e., edges of the feedback signal $S_b$ where the feedback signal $S_b$ changes from a low level to a high level; and the second edge EG2 is a falling edge, that is, an edge of the feedback signal $S_b$ where the feedback signal $S_b$ changes from a high level to a low level. However, the present disclosure is not limited thereto, and the first edge EG1 and the third edge EG3 may both be falling edges, and accordingly, the second edge EG2 may be a rising edge.

For example, in the present disclosure, the response time of the frequency detector 121 is one feedback period $T_b$ of the feedback signal $S_b$, and the response speed of frequency detector 121 is fast.

In should be noted that in FIGS. 7A to 7D, $S_i$ denotes an input signal having the input frequency $f_i$, $S_{im1}$ denotes a first intermediate signal having the first intermediate frequency $f_{im1}$, and $S_b$ denotes a feedback signal having the feedback frequency $f_b$.

For example, as shown in FIG. 6, the third frequency division circuit 1212 is configured to receive the input signal $S_i$ having the input frequency $f_i$ and perform frequency division on the input signal $S_i$ to obtain the first intermediate signal Simi having the first intermediate frequency $f_{im1}$. For example, a third frequency division coefficient of the third frequency division circuit 1212 is 2.

For example, as shown in FIG. 6, the first circuit 1210 is configured to determine and output a first logic value LO1 of the first edge EG1, a second logic value LO2 of the second edge EG2, and a third logic value LO3 of the third edge EG3. The second circuit 1211 is configured to generate and output the first sub-control signal or the second sub-control signal according to the first logic value LO1, the second logic value LO2, and the third logic value LO3.

For example, the first circuit 1210 may include a first input terminal, a second input terminal, a first clock terminal, a second clock terminal, a first output terminal, a second output terminal, and a third output terminal. The first input terminal and the second input terminal of the first circuit 1210 are configured to receive the first intermediate signal Simi, the first clock terminal and the second clock terminal of the first circuit 1210 are configured to receive the feedback signal $S_b$, the first output terminal of the first circuit 1210 is configured to output the first logic value LO1 of the first edge EG1, the second output terminal of the first circuit 1210 is configured to output the second logic value LO2 of the second edge EG2, and the third output terminal of the first circuit 1210 is configured to output the third logic value LO3 of the third edge EG3.

For example, the second circuit 1211 may include a first input terminal, a second input terminal, a third input terminal, a fourth input terminal, a first output terminal, and a second output terminal. The first output terminal of the first circuit 1210 is electrically connected to the first input terminal of the second circuit 1211, the second output terminal of the first circuit 1210 is electrically connected to the second input terminal and the third input terminal of the second circuit 1211, the third output terminal of the first circuit 1210 is electrically connected to the fourth input terminal of the second circuit 1211, the first output terminal of the second circuit 1211 is configured to output the first sub-control signal, and the second output terminal of the second circuit 1211 is configured to output the second sub-control signal.

For example, in one example, as shown in FIG. 6, the first circuit 1210 may include a first D flip-flop D1, a second D flip-flop D2, a third D flip-flop D3, a fourth D flip-flop D4, and a first NOT gate NR1. The second circuit 1211 may include a first XOR gate XR1, a second XOR gate XR2, a second NOT gate NR2, a third NOT gate NR3, a first AND gate AR1, and a second AND gate AR2.

For example, each D flip-flop may include a data input terminal D, a clock input terminal C, a preset terminal SET, a reset terminal CLR, an output terminal Q, and an output terminal Q. For example, as shown in FIG. 6, the first input terminal of the first circuit 1210 is the data input terminal D of the first D flip-flop D1, the second input terminal of the first circuit 1210 is the data input terminal D of the third D flip-flop D3, the first clock terminal of the first circuit 1210 is the clock input terminal C of the first D flip-flop D1, the second clock terminal of the first circuit 1210 is an input terminal of the first NOT gate NR1, the first output terminal of the first circuit 1210 is the output terminal Q of the first D flip-flop D1, the second output terminal of the first circuit 1210 is the output terminal Q of the fourth D flip-flop D4, and the third output terminal of the first circuit 1210 is the output terminal Q of the second D flip-flop D2.

For example, the first input terminal of the second circuit 1211 is a first data input terminal of the first XOR gate XR1, the second input terminal of the second circuit 1211 is a second data input terminal of the first XOR gate XR1, the third input terminal of the second circuit 1211 is a second data input terminal of the second XOR gate XR2, the fourth input terminal of the second circuit 1211 is a first data input terminal of the second XOR gate XR2, the first output terminal of the second circuit 1211 is an output terminal of the first AND gate AR1, and the second output terminal of the second circuit 1211 is an output terminal of the second AND gate AR2.

For example, as shown in FIG. 6, the data input terminal D of the first D flip-flop D1 is electrically connected to the output terminal of the third frequency division circuit 1212 and is configured to receive the first intermediate signal Simi, the clock input terminal C of the first D flip-flop D1 is configured to receive the feedback signal $S_b$, the output terminal Q of the first D flip-flop D1 is connected to the data input terminal D of the second D flip-flop D2 and the first data input terminal of the first XOR gate XR1, and the output terminal Q of the first D flip-flop D1 is configured to output the first logic value LO1. The clock input terminal C of the second D flip-flop D2 is configured to receive the feedback signal $S_b$, the output terminal Q of the second D flip-flop D2 is connected to the first data input terminal of the second XOR gate XR2, and the output terminal Q of the second D flip-flop D2 is configured to output the third logic value LO3.

For example, as shown in FIG. 6, the first NOT gate NR1 is configured to receive the feedback signal $S_b$ and invert the feedback signal $S_b$ to obtain an intermediate feedback signal. For example, the input terminal of the first NOT gate NR1 is configured to receive the feedback signal $S_b$, and the output terminal of the first NOT gate NR1 is configured to output the intermediate feedback signal.

For example, as shown in FIG. 6, the data input terminal D of the third D flip-flop D3 is electrically connected to the output terminal of the third frequency division circuit 1212 and is configured to receive the first intermediate signal Simi, the clock input terminal C of the third D flip-flop D3 is electrically connected to the output terminal of the first NOT gate NR1 and is configured to receive the intermediate feedback signal, and the output terminal Q of the third D flip-flop D3 is connected to the data input terminal D of the fourth D flip-flop D4. The clock input terminal C of the fourth D flip-flop D4 is configured to receive the feedback signal $S_b$, the output terminal Q of the fourth D flip-flop D4 is connected to the second data input terminal of the first XOR gate XR1 and the second data input terminal of the second XOR gate XR2, and the output terminal Q of the fourth D flip-flop D4 is configured to output the second logic value LO2.

For example, as shown in FIG. 6, an output terminal of the first XOR gate XR1 is connected to an input terminal of the second NOT gate NR2 and a first data input terminal of the first AND gate AR1; an output terminal of the second XOR gate XR2 is connected to an input terminal of the third NOT gate NR3 and a second data input terminal of the first AND gate AR1; and an output terminal of the second NOT gate NR2 is connected to a first data input terminal of the second AND gate AR2, and an output terminal of the third NOT gate NR3 is connected to a second data input terminal of the second AND gate AR2. An output terminal of the first AND gate AR1 is configured to output the first sub-control signal Cf, and an output terminal of the second AND gate AR2 is configured to output the second sub-control signal Cs.

For example, as shown in FIG. 7A, in a case where the input frequency $f_i$ is greater than the feedback frequency $f_b$, a level of the first intermediate signal $S_{im1}$ corresponding to the first edge EG1 of the feedback signal $S_b$ is a low level at a certain time, and thus, the first logic value LO1 of the first edge EG1 is 0 at this time; a level of the first intermediate signal Simi corresponding to the second edge EG2 of the feedback signal $S_b$ is a high level, and thus, the second logic value LO2 of the second edge EG2 is 1 at this time; and a level of the first intermediate signal Simi corresponding to the third edge EG3 of the feedback signal $S_b$ is a low level, and thus, the third logic value LO3 of the third edge EG3 is 0. In the example shown in FIG. 7A, at this time, the first XOR gate XR1 receives the first logic value LO1 (i.e., 0) and the second logic value LO2 (i.e., 1), and outputs a logic value 1 according to the first logic value LO1 and the second logic value LO2, and the second XOR gate XR2 receives the second logic value LO2 (i.e., 1) and the third logic value (i.e., 0), and outputs a logic value 1 according to the second logic value LO2 and the third logic value LO3. At this time, both the first data input terminal and the second data input terminal of the first AND gate AR1 receive the logic value 1, thereby the first AND gate AR1 outputs the first sub-control signal Cf which is at a high level; and the first data input terminal and the second data input terminal of the second AND gate AR2 both receive the logic value 0, thereby the second AND gate AR2 outputs the second sub-control signal Cs which is at a low level.

For example, as shown in FIG. 7B, in a case where the input frequency $f_i$ is greater than the feedback frequency $f_b$, a level of the first intermediate signal Simi corresponding to the first edge EG1 of the feedback signal $S_b$ is a high level at a certain time, and thus the first logic value LO1 of the first edge EG1 is 1 at this time; a level of the first intermediate signal Simi corresponding to the second edge EG2 of the feedback signal $S_b$ is a low level, and thus the second logic value LO2 of the second edge EG2 is 0; and a level of the first intermediate signal $S_{im1}$ corresponding to the third edge EG3 of the feedback signal $S_b$ is a high level, and thus the third logic value LO3 of the third edge EG3 is 1. In the example shown in FIG. 7B, at this time, the first XOR gate XR1 receives the first logic value LO1 (i.e., 1) and the second logic value LO2 (i.e., 0), and outputs a logic value 1 according to the first logic value LO1 and the second logic value LO2, and the second XOR gate XR2 receives the second logic value LO2 (i.e., 0) and the third logic value LO3 (i.e., 1), and outputs a logic value 1 according to the second logic value LO2 and the third logic value LO3. At this time, both the first data input terminal and the second data input terminal of the first AND gate AR1 receive the logic value 1, thereby the first AND gate AR1 outputs the first sub-control signal Cf which is at a high level; the first data input terminal and the second data input terminal of the second AND gate AR2 both receive the logic value 0, thereby the second AND gate AR2 outputs the second sub-control signal Cs which is at a low level.

It should be noted that in a case where the input frequency $f_i$ is greater than the feedback frequency $f_b$, except for the time shown in FIGS. 7A and 7B, under the control of the first logic value LO1, the second logic value LO2 and the third logic value LO3, one of the first XOR gate XR1 and the second XOR gate XR2 outputs a logic value 1 and the other of the first XOR gate XR1 and the second XOR gate XR2 outputs a logic value 0. In these cases, the first AND gate AR1 outputs the first sub-control signal Cf having a low level; and the second AND gate AR2 outputs the second sub-control signal Cs having a low level.

For example, as shown in FIG. 7C, in a case where the input frequency $f_i$ is less than the feedback frequency $f_b$, a level of the first intermediate signal $S_{im1}$ corresponding to the first edge EG1 of the feedback signal $S_b$ is a high level at a certain time, and thus the first logic value LO1 of the first edge EG1 is 1 at this time; a level of the first intermediate signal $S_{im1}$ corresponding to the second edge EG2 of the feedback signal $S_b$ is a high level, and thus the second logic value LO2 of the second edge EG2 is 1 at this time; and a level of the first intermediate signal Simi corresponding to the third edge EG3 of the feedback signal $S_b$ is a high level, and thus the third logic value LO3 of the third edge EG3 is 1. In the example shown in FIG. 7C, at this time, the first XOR gate XR1 receives the first logic value LO1 (i.e., 1) and the second logic value LO2 (i.e., 1), and outputs a logic value 0 according to the first logic value LO1 and the second logic value LO2, the second XOR gate XR2 receives the second logic value LO2 (i.e., 1) and the third logic value LO3 (i.e., 1), and outputs a logic value 0 according to the second logic value LO2 and the third logic value LO3. At this time, both the first data input terminal and the second data input terminal of the first AND gate AR1 receive the logic value 0, thereby the first AND gate AR1 outputs the first sub-control signal Cf having a low level; and the first data input terminal and the second data input terminal of the second AND gate AR2 both receive the logic value 1, thereby the second AND gate AR2 outputs the second sub-control signal Cs having a high level.

For example, as shown in FIG. 7D, in a case where the input frequency $f_i$ is less than the feedback frequency $f_b$, a level of the first intermediate signal Simi corresponding to the first edge EG1 of the feedback signal $S_b$ is a low level at a certain time, and thus the first logic value LO1 of the first edge EG1 is 0 at this time; a level of the first intermediate signal Simi corresponding to the second edge EG2 of the feedback signal $S_b$ is a low level, and thus the second logic value LO2 of the second edge EG2 is 0; and a level of the first intermediate signal $S_{im1}$ corresponding to the third edge EG3 of the feedback signal $S_b$ is a low level, and thus the third logic value LO3 of the third edge EG3 is 0. In the example shown in FIG. 7D, at this time, the first XOR gate XR1 receives the first logic value LO1 (i.e., 0) and the second logic value LO2 (i.e., 0), and outputs a logic value 0 according to the first logic value LO1 and the second logic value LO2, and the second XOR gate XR2 receives the second logic value LO2 (i.e., 0) and the third logic value LO3 (i.e., 0), and outputs a logic value 0 according to the second logic value LO2 and the third logic value LO3. At this time, both the first data input terminal and the second data input terminal of the first AND gate AR1 receive the logic value 0, thereby the first AND gate AR1 outputs the first sub-control signal Cf having a low level; and the first data input terminal and the second data input terminal of the second AND gate AR2 both receive the logic value 1, thereby the second AND gate AR2 outputs the second sub-control signal Cs having a high level.

It should be noted that in a case where the input frequency $f_i$ is less than the feedback frequency $f_b$, except for the time shown in FIGS. 7C and 7D, under the control of the first logic value LO1, the second logic value LO2 and the third logic value LO3, one of the first XOR gate XR1 and the second XOR gate XR2 outputs a logic value 1 and the other of the first XOR gate XR1 and the second XOR gate XR2 outputs a logic value 0. In these cases, the first AND gate AR1 outputs the first sub-control signal Cf having a low level; and the second AND gate AR2 outputs the second sub-control signal Cs having a low level.

Based on the above circuit structure and principle, the frequency detector 121 may determine which of the input signal and the feedback signal has a faster (or slower) frequency, and output the first sub-control signal Cf or the second sub-control signal Cs according to the result of the determination, to indicate which of the input signal and the feedback signal has a faster (or slower) frequency.

Although the structure of the TAF-FLL according to the exemplary embodiment of the present disclosure has been described above, however, the present disclosure is not limited thereto. Various TAF-FLLs implemented based on TAF-DPS can be provided.

Figure 8:
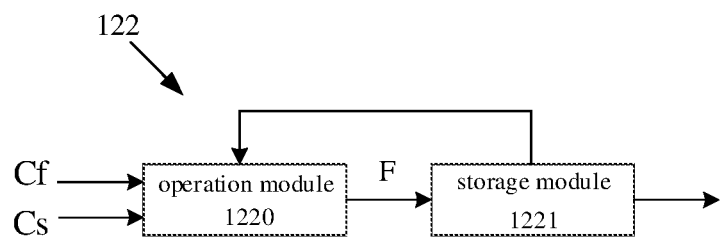
FIG. 8 shows a schematic structural diagram of a controller according to an exemplary embodiment of the present disclosure.

FIG. 8 shows a schematic structural diagram of the controller 122 according to an exemplary embodiment of the present disclosure.

For example, in some embodiments, as shown in FIG. 8, the controller 122 may include an operation module 1220 and a storage module 1221. The operation module 1220 is configured to, according to the first sub-control signal Cf, subtract a first adjustment parameter from the current frequency control word to generate a frequency control word F; alternatively, the operation module 1220 is configured to, according to the second sub-control signal Cs, add the current frequency control word to a second adjustment parameter to generate the frequency control word F. The storage module 1221 is configured to store the current frequency control word and the frequency control word F.

For example, in some embodiments, signs of the first adjustment parameter and the second adjustment parameter are the same, the first adjustment parameter and the second adjustment parameter may be the same, and both the first adjustment parameter and the second adjustment parameter are 1. However, the present disclosure is not limited thereto. For example, the first adjustment parameter and the second adjustment parameter are both 2. For example, the first adjustment parameter and the second adjustment parameter may be different, the first adjustment parameter may be 1 and the second adjustment parameter may be 2. In other embodiments, a sign of the first adjustment parameter and a sign of the second adjustment parameter may be opposite, for example, the first adjustment parameter may be −1 and the second adjustment parameter may be 1. In this case, the controller 122 may include an adder and a storage module. The adder is configured to, according to the first sub-control signal Cf, add the first adjustment parameter to the current frequency control word to generate the frequency control word F; alternatively, the adder is configured to, according to the second sub-control signal Cs, add the current frequency control word to the second adjustment parameter to generate the frequency control word F. The storage module is configured to store the current frequency control word and the frequency control word F.

For example, the controller 122 may further include an output module (not shown), and the output module is used for acquiring the frequency control word F from, for example, the storage module 1221 under control of a clock signal and outputting the frequency control word F to the digital voltage controlled oscillator 123.

For example, the storage module 1221 may be various types of storage media. The operation module 1220 and the output module may be implemented using hardware circuits. The operation module 1220 may be composed of, for example, transistors, resistors, capacitors, amplifiers, and the like. The output module may be constituted by elements such as flip-flops. Of course, the functions of the operation module 1220 and the output module can also be achieved by software. For example, computer instructions and data may also be stored in the storage module 1221, and may be executed by a processor to implement the functions of the operation module 1220 and the output module.

Furthermore, as an example, the oscillation circuit 11 may be an RC oscillation circuit including a variable resistor (R) and a capacitor (C), the variable resistor is the element to be measured. The frequency of the output signal of the RC oscillation circuit is:

$$f_{osc} = \frac{1}{2\pi RC}.$$

In the above equation, $f_{osc}$ is the frequency of the output signal of the RC oscillation circuit, R is the resistance value of the variable resistor, and C is the capacitance value of the capacitor. It can be seen that the frequency of the output signal of the RC oscillation circuit is correlated with the resistance value R of the variable resistor. However, the type of the oscillation circuit in the embodiment of the present disclosure is not limited thereto. By correlating the frequency of the output signal with the resistance value, other types of oscillation circuits can be designed.

In the embodiments where the oscillation circuit 11 is an RC oscillation circuit, the output signal of the RC oscillation circuit is output to the TAF-FLL 12, and it can be obtained that:

$$f_{osc} = \frac{1}{2\pi RC} = f_i = \frac{f_\Delta}{N \cdot FREQ}.$$

Therefore, the relationship between the resistance value of the variable resistor in the RC oscillation circuit and the TAF-FLL 12 can be expressed by an equation of:

$$R = \frac{N \cdot FREQ}{2\pi C f_\Delta} = k \cdot FREQ.$$

In the above equation, $$k = \frac{N}{2\pi C f_\Delta}.$$

The above equation shows that the resistance value of the variable resistor can be obtained through the frequency control word FREQ output by the TAF-FLL 12.

Figure 9:
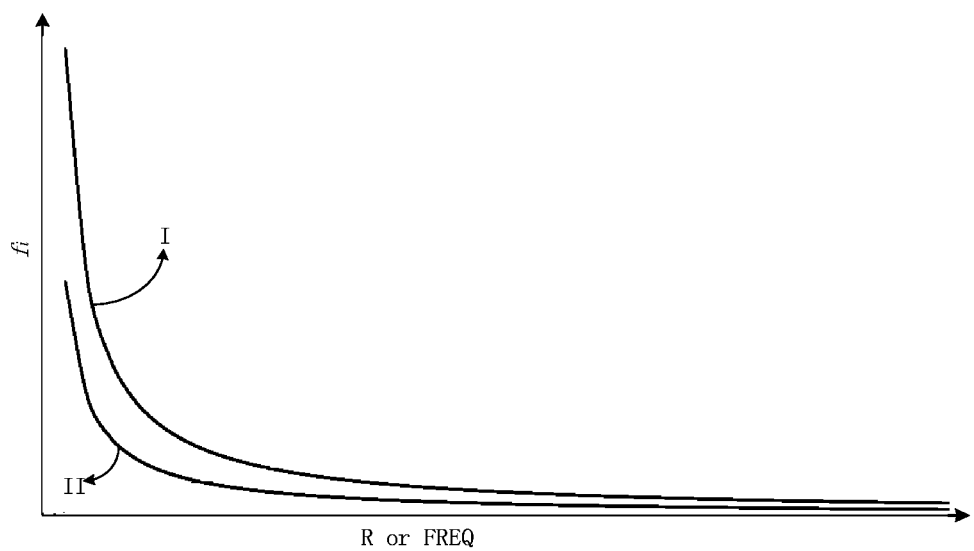
FIG. 9 shows a schematic diagram of a relationship between an output frequency of an RC oscillation circuit and a resistance value of a variable resistor and a relationship between the output frequency of the RC oscillation circuit and a frequency control word output by a TAF-FLL, according to an exemplary embodiment of the present disclosure, a horizontal axis represents the frequency control word output by the TAF-FLL (for curve I) or the resistance value of the variable resistor (for curve II), and a vertical axis represents the output frequency of the RC oscillation circuit.
Figure 10:
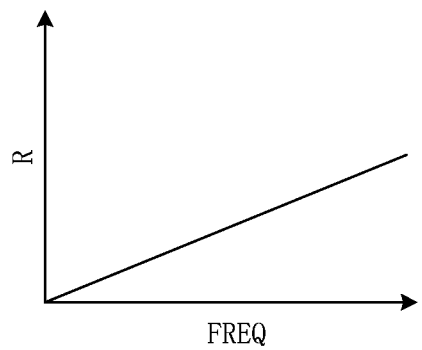
FIG. 10 shows a schematic diagram of a relationship between a resistance value of a variable resistor and a frequency control word output by a TAF-FLL according to an exemplary embodiment of the present disclosure, a horizontal axis represents the frequency control word output by the TAF-FLL, and a vertical axis represents the resistance value of the variable resistor.

FIG. 9 shows a schematic diagram of a relationship between the output frequency of the RC oscillation circuit and the resistance value of the variable resistor, and a relationship between the output frequency of the RC oscillation circuit and the frequency control word output by the TAF-FLL 12, according to an exemplary embodiment of the present disclosure, the horizontal axis represents the frequency control word output by the TAF-FLL (for curve I) or the resistance value of the variable resistor (for curve II), and the vertical axis represents the output frequency of the RC oscillation circuit. From FIG. 9, it can be seen that the output frequency of the RC oscillation circuit is inversely proportional to the resistance value of the variable resistor and the frequency control word FREQ output by the TAF-FLL 12, respectively. FIG. 10 shows a schematic diagram of a relationship between the resistance value of the variable resistor and the frequency control word FREQ output by the TAF-FLL 12 according to an exemplary embodiment of the present disclosure. From FIG. 10, it can be seen that the resistance value of the variable resistor is linearly related to the frequency control word FREQ output by the TAF-FLL 12. Therefore, the frequency control word FREQ output by the TAF-FLL 12 can be used to represent the resistance value of the variable resistor, thereby achieving the resistance measurement. Also, the greater the number of decimal places of the frequency control word FREQ, the higher the measurement accuracy. Therefore, the measuring device according to the embodiment of the present disclosure can implement high-precision measurement.

For example, the variable resistor according to some exemplary embodiments of the present disclosure may be a thermistor for implementing a temperature measuring device. The typical characteristic of the thermistor is that the thermistor is sensitive to temperature and shows different resistance values at different temperatures. The types of the thermistors are divided into positive temperature coefficient (PTC) thermistors and negative temperature coefficient (NTC) thermistors according to different temperature coefficients. The higher the temperature, the greater the resistance value of the PTC thermistor, and the lower the resistance value of the NTC thermistor. The embodiments of the present disclosure do not limit the types and materials of the thermistors, etc. For example, the material of the PTC thermistor may be a metal material (platinum resistance, nickel resistance, copper resistance, etc.), a polymer material, a compound material (such as barium titanate, silver sulfide), a semiconductor material, etc. The NTC thermistor will be taken as an example to describe below. The temperature calculation equation of the NTC thermistor is:

$$T = \frac{\ln(R/R_0)}{B} + \frac{1}{T_0}.$$

In the above equation, T represents the measured temperature, R represents the resistance value of the thermistor when the temperature is T, B represents the sensitivity index of the thermistor, $T_0$ represents the initial temperature, and $R_0$ represents the initial resistance value of the NTC thermistor. From the above formula, it can be seen that as long as the resistance value R of the thermistor is known, the ambient temperature T of the environment where the corresponding thermistor is located can be calculated. Combining the relationship between the resistance value of the thermistor and the frequency control word FREQ output by TAF-FLL 12, and the relationship between the resistance value of the thermistor and the ambient temperature T of the environment at which the thermistor is located, the relationship between the ambient temperature T of the environment at which the thermistor is located and the frequency control word FREQ output by the TAF-FLL 12 can be obtained as shown in the following equation:

$$T = \frac{\ln(k \cdot FREQ/R_0)}{B} + \frac{1}{T_0}.$$

In the above equation, $$k = \frac{N}{2\pi C f_\Delta}.$$

Figure 11:
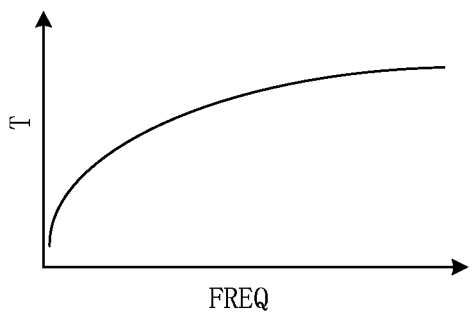
FIG. 11 shows a schematic diagram of a relationship between a temperature of an environment at which a NTC thermistor is located and a frequency control word output by a TAF-FLL according to an exemplary embodiment of the present disclosure, a horizontal axis represents the frequency control word output by the TAF-FLL, and a vertical axis represents the temperature of the environment at which the NTC thermistor is located.

FIG. 11 shows a schematic diagram of the relationship between the temperature of the environment at which the NTC thermistor is located and the frequency control word FREQ output by the TAF-FLL 12. From FIG. 11, it can be seen that the temperature T is a monotonic function of the frequency control word FREQ output by the TAF-FLL 12, and thus the temperature of the environment at which the NTC thermistor is located can be obtained through the frequency control word FREQ output by the TAF-FLL 12, thereby achieving the temperature measurement.

Figure 12:
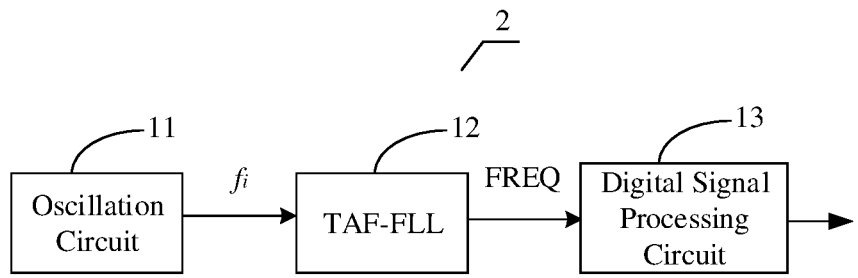
FIG. 12 shows a schematic structural diagram of a measuring device according to an exemplary embodiment of the present disclosure.

FIG. 12 shows a schematic structural diagram of a measuring device according to an exemplary embodiment of the present disclosure. Referring to FIG. 12, compared with the measuring device shown in FIG. 1, the measuring device according to the exemplary embodiment of the present disclosure further includes a digital signal processing circuit 13, and the embodiment of the present disclosure is not limited to the specific configuration or implementation of the digital signal processing circuit 13. The TAF-FLL 12 receives the signal having the oscillation frequency $f_i$ output by the oscillation circuit 11 and outputs the frequency control word FREQ correlated with the oscillation frequency and the digital signal processing circuit 13 may be configured to read the frequency control word FREQ output by the TAF-FLL 12 and obtain the element value of the element to be measured according to the read frequency control word FREQ.

For example, the element to be measured may be a variable resistor. In a case where the element to be measured is a variable resistor, the digital signal processing circuit 13 may be configured to receive the frequency control word FREQ output by the TAF-FLL 12 and obtain the resistance value of the variable resistor according to the relationship between the resistance value of the variable resistor and the frequency control word FREQ output by the TAF-FLL 12. The relationship between the resistance value of the variable resistor and the frequency control word FREQ output by the TAF-FLL 12 can refer to the previous detailed description.

As another example, in a case where the variable resistor is a thermistor, the digital signal processing circuit 13 may be further configured to obtain the ambient temperature of the environment at which the thermistor is located according to the resistance value of the thermistor. The relationship between the resistance value of the thermistor and the ambient temperature of the environment at which the thermistor is located can refer to the previous detailed description.

According to the exemplary embodiment of the present disclosure, both the TAF-FLL 12 and the digital signal processing circuit 13 can adopt an all-digital design, and thus the measuring device according to the exemplary embodiment of the present disclosure is easy to integrate, and has a small volume, low power consumption, and high reliability.

According to an exemplary embodiment of the present disclosure, the TAF-FLL 12 and digital signal processing circuit 13 may be disposed in the same chip. For example, the TAF-FLL 12 and the digital signal processing circuit 13 may be integrated in a System on Chip (SOC), or manufactured as separate application specific integrated circuits (ASIC), or at least partially implemented using a programmable logic array (FPGA), etc.

Exemplary embodiments of the measuring device are described above in a case where the element to be measured is a variable resistor. It will be apparent to those skilled in the art that similar devices can be used to implement to measure the element values of other elements to be measured or other parameters correlated with the element values of the elements to be measured. For example, in a case where the element to be measured is a variable capacitor, a signal having an oscillation frequency correlated with the capacitance value of the variable capacitor can be output through an oscillation circuit including the variable capacitor, and the capacitance value of the variable capacitor can be obtained through the frequency control word FREQ output by the TAF-FLL, thereby achieving the capacitance measurement. For example, in a case where the element to be measured is a variable inductor, a signal having an oscillation frequency correlated with the inductance value of the variable inductor can be output through an oscillation circuit including the variable inductor, and the inductance value of the variable inductor can be obtained through the frequency control word FREQ output by the TAF-FLL, thereby achieving the inductance measurement.

From the above description, it can be seen that the measuring device provided by various embodiments of the present disclosure has at least the following advantages:

1. Because the TAF-FLL and the digital signal processing circuit in the measuring device can adopt the all-digital design, the measuring device provided by various embodiments of the present disclosure is easy to integrate, and has a small volume, low power consumption, and high reliability.

2. Because the number of decimal places of the frequency control word FREQ of the TAF-FLL in the measuring device can be set to be sufficient, and the more the decimal places of the frequency control word FREQ, the higher the measurement accuracy. Therefore, the measuring device according to the embodiments of the present disclosure can achieve high-precision measurement.

Figure 13:
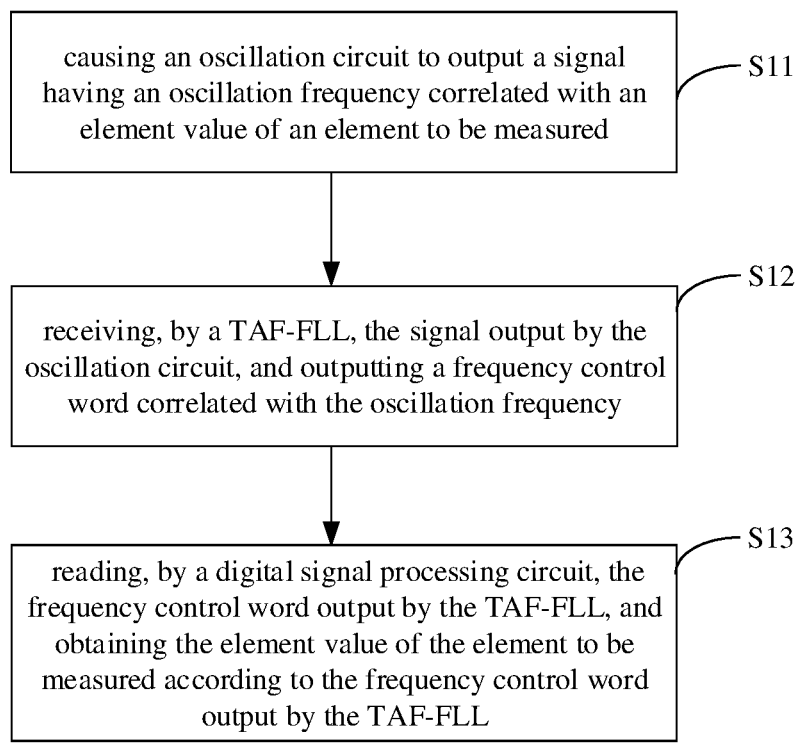
FIG. 13 shows a flowchart of a measuring method according to an exemplary embodiment of the present disclosure.

FIG. 13 shows a flowchart of a measuring method according to an exemplary embodiment of the present disclosure. Referring to FIG. 13, a measuring method according to an exemplary embodiment of the present disclosure includes the steps of:

S11: causing an oscillation circuit to output a signal having an oscillation frequency correlated with an element value of an element to be measured;

S12: receiving, by a TAF-FLL, the signal output by the oscillation circuit, and outputting a frequency control word correlated with the oscillation frequency;

S13: reading, by a digital signal processing circuit, the frequency control word output by the TAF-FLL, and obtaining the element value of the element to be measured according to the frequency control word output by the TAF-FLL.

Because the frequency control word output by the TAF-FLL is correlated with the frequency of the output signal of the oscillation circuit, and the frequency of the output signal of the oscillation circuit is correlated with the element value of the element to be measured, the element value of the element to be measured or other parameters correlated with the element value of the element to be measured can be obtained according to the frequency control word.

For example, the element to be measured may be one of a group consisting of a resistor, a capacitor, or an inductor. In a case where the element to be measured is a variable resistor, FIG. 14 shows a flowchart of a resistance measuring method according to an exemplary embodiment of the present disclosure.

Figure 14:
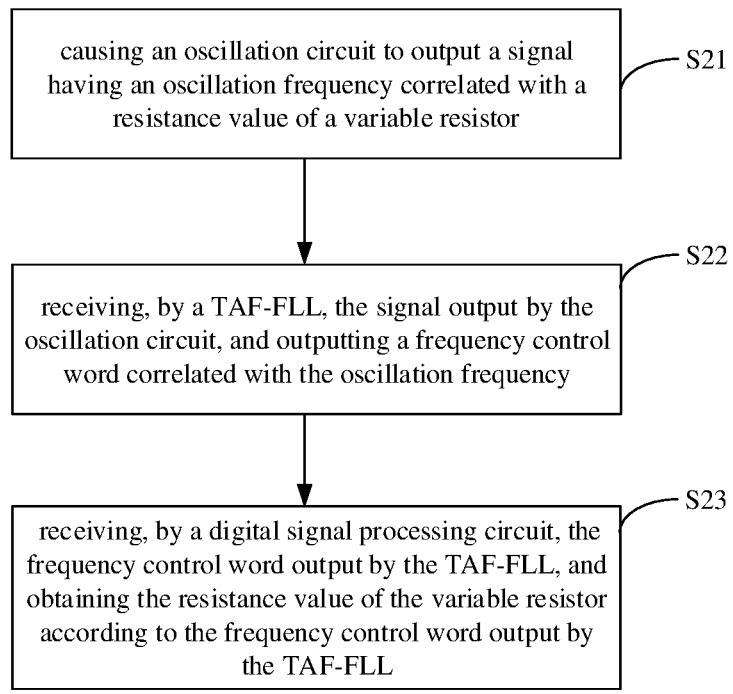
FIG. 14 shows a flowchart of a resistance measuring method according to an exemplary embodiment of the present disclosure.

Referring to FIG. 14, the resistance measuring method according to an exemplary embodiment of the present disclosure includes the steps of:

S21: causing an oscillation circuit to output a signal having an oscillation frequency correlated with a resistance value of a variable resistor;

S22: receiving, by a TAF-FLL, the signal output by the oscillation circuit, and outputting a frequency control word correlated with the oscillation frequency;

S23: receiving, by a digital signal processing circuit, the frequency control word output by the TAF-FLL, and obtaining the resistance value of the variable resistor according to the frequency control word output by the TAF-FLL.

Because the frequency control word output by the TAF-FLL is correlated with the frequency of the output signal of the oscillation circuit, and the frequency of the output signal of the oscillation circuit is correlated with the resistance value of the variable resistor, the resistance value of the variable resistor can be obtained through the frequency control word, thus achieving the resistance measurement. It should be noted that the relationship between the frequency control word output by the TAF-FLL and the resistance value of the variable resistor can refer to the previous description.

Figure 15:
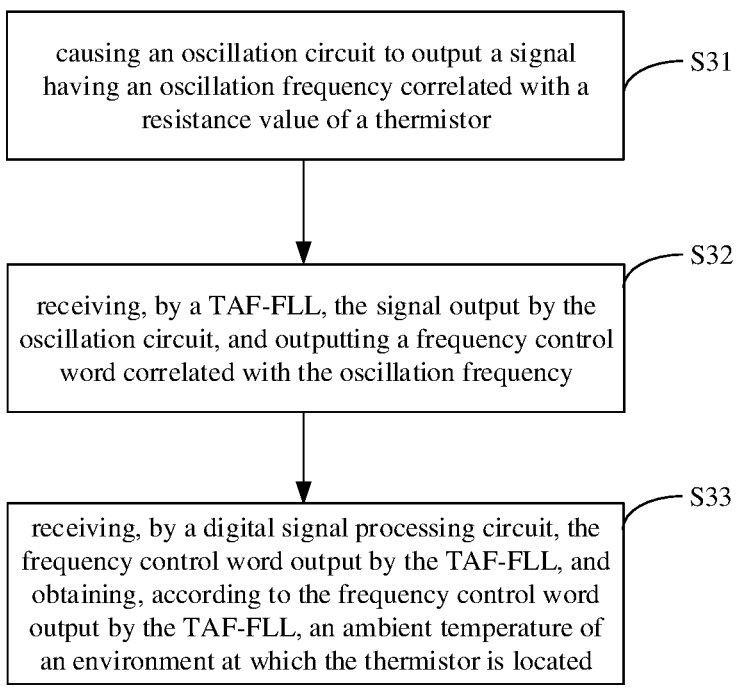
FIG. 15 shows a flowchart of a temperature measuring method according to an exemplary embodiment of the present disclosure.

FIG. 15 shows a flowchart of a temperature measuring method according to an exemplary embodiment of the present disclosure. Referring to FIG. 15, a temperature measuring method according to an exemplary embodiment of the present disclosure includes the steps of:

S31: causing an oscillation circuit to output a signal having an oscillation frequency correlated with a resistance value of a thermistor;

S32: receiving, by a TAF-FLL, the signal output by the oscillation circuit, and outputting a frequency control word correlated with the oscillation frequency;

S33: receiving, by a digital signal processing circuit, the frequency control word output by the TAF-FLL, and obtaining, according to the frequency control word output by the TAF-FLL, an ambient temperature of an environment at which the thermistor is located.

In step S33, because the frequency control word output by the TAF-FLL is correlated with the resistance value of the thermistor, and the resistance value of the thermistor is correlated with the ambient temperature of the environment at which the thermistor is located, the ambient temperature of the environment at which the thermistor is located can be obtained through the resistance value of the thermistor, thereby achieving the temperature measurement. It should be noted that the relationship between the frequency control word output by the TAF-FLL and the resistance value of the thermistor or the ambient temperature of the environment at which the thermistor is located can refer to the previous description.

It should be noted that the measuring method provided by various embodiments of the present disclosure can be applied to the measuring device in any of the above embodiments.

Exemplary embodiments of the measuring method in a case where the element to be measured is a variable resistor are described above. It will be apparent to those skilled in the art that similar methods can be used to implement to measure the element values of other elements to be measured or other parameters correlated with the element values of the elements to be measured. For example, in a case where the element to be measured is a variable capacitor, a signal having an oscillation frequency correlated with the capacitance value of the variable capacitor can be output through an oscillation circuit including the variable capacitor, and the capacitance value of the variable capacitor can be obtained through the frequency control word FREQ output by the TAF-FLL, thereby achieving the capacitance measurement. For example, in a case where the element to be measured is a variable inductor, a signal having an oscillation frequency correlated with the inductance value of the variable inductor can be output through an oscillation circuit including the variable inductor, and the inductance value of the variable inductor can be obtain through the frequency control word FREQ output by the TAF-FLL, thereby achieving the inductance measurement.

From the above description, it can be seen that the measuring method provided by various embodiments of the present disclosure has at least the following advantages:

1. all the devices used in the measuring method except the oscillation circuit are digital circuits, and thus the measuring method is stable and reliable;

2. the measuring method can enable a TAF-FLL to output a frequency control word with a sufficient number of decimal places, thus achieving the high-precision measurement.

What are described above is related to the illustrative embodiments of the present disclosure only and not intended to limit the protection scope of the present disclosure; and the protection scope of the present disclosure are defined by the appended claims.

What is claimed is:

1. A measuring device, comprising:
   an oscillation circuit, comprising an element to be measured and configured to output a signal having an oscillation frequency correlated with an element value of the element to be measured;
   a time average frequency-frequency lock loop, configured to receive the signal output by the oscillation circuit and output a frequency control word correlated with the oscillation frequency; and
   a digital signal processing circuit, configured to read the frequency control word output by the time average frequency-frequency lock loop and obtain the element value of the element to be measured according to the frequency control word that is read.

2. The measuring device according to claim 1, wherein the time average frequency-frequency lock loop comprises a frequency detector, a controller, a frequency divider, and a digital voltage controlled oscillator,
   the frequency detector is configured to output a control signal to the controller according to an input signal and a feedback signal fed back by the frequency divider;
   the controller is configured to adjust the frequency control word according to the control signal and output an adjusted frequency control word to the digital voltage controlled oscillator;
   the frequency divider is configured to perform frequency division on a received signal and feed a frequency-divided signal back to the frequency detector, wherein a frequency division ratio is N, and N is a real number greater than or equal to 1; and
   the digital voltage controlled oscillator is configured to output a signal having a frequency correlated with the adjusted frequency control word that is received to the frequency divider based on time-average-frequency direct period synthesis, and output the frequency control word, which is received by the digital voltage controlled oscillator when the time average frequency-frequency lock loop is in a lock state.

3. The measuring device according to claim 2, wherein the frequency detector is configured to determine a magnitude relationship between an input frequency of the input signal and a feedback frequency of the feedback signal to obtain the control signal, wherein the control signal comprises a first sub-control signal and a second sub-control signal, the frequency detector is configured to generate and output the first sub-control signal in a case where the input frequency is greater than the feedback frequency, and the frequency detector is configured to generate and output the second sub-control signal in a case where the input frequency is less than the feedback frequency.

4. The measuring device according to claim 3, wherein the controller is configured to, according to the first sub-control signal, subtract a first adjustment parameter from a current frequency control word to generate the adjusted frequency control word; or
   the controller is configured to, according to the second sub-control signal, add a second adjustment parameter to the current frequency control word to generate the adjusted frequency control word.

5. The measuring device according to claim 2, wherein the frequency detector comprises a first circuit, a second circuit, and a third frequency division circuit,
   one feedback period of the feedback signal comprises a first edge, a second edge, and a third edge, the second edge is between the first edge and the third edge,
   the third frequency division circuit is configured to receive the input signal and perform frequency division on the input signal to obtain a first intermediate signal having a first intermediate frequency, a third frequency division coefficient of the third frequency division circuit is 2;
   the first circuit is configured to determine and output a first logic value of the first edge, a second logic value of the second edge, and a third logic value of the third edge;
   the second circuit is configured to generate and output the first sub-control signal or the second sub-control signal according to the first logic value, the second logic value, and the third logic value.

6. The measuring device according to claim 5, wherein the first circuit comprises a first D flip-flop, a second D flip-flop, a third D flip-flop, a fourth D flip-flop, and a first NOT gate, and the second circuit comprises a first XOR gate, a second XOR gate, a second NOT gate, a third NOT gate, a first AND gate, and a second AND gate,
   a data input terminal of the first D flip-flop is configured to receive the first intermediate signal, a clock input terminal of the first D flip-flop is configured to receive the feedback signal, an output terminal of the first D flip-flop is connected to a data input terminal of the second D flip-flop and a first data input terminal of the first XOR gate, the output terminal of the first D flip-flop is configured to output the first logic value;
   a clock input terminal of the second D flip-flop is configured to receive the feedback signal, an output terminal of the second D flip-flop is connected to a first data input terminal of the second XOR gate, the output terminal of the second D flip-flop is configured to output the third logic value;
   the first NOT gate is configured to receive the feedback signal and invert the feedback signal to obtain an intermediate feedback signal;
   a data input terminal of the third D flip-flop is configured to receive the first intermediate signal, a clock input terminal of the third D flip-flop is configured to receive the intermediate feedback signal, and an output terminal of the third D flip-flop is connected to a data input terminal of the fourth D flip-flop;
   a clock input terminal of the fourth D flip-flop is configured to receive the feedback signal, an output terminal of the fourth D flip-flop is connected to a second data input terminal of the first XOR gate and a second data input terminal of the second XOR gate, the output terminal of the fourth D flip-flop is configured to output the second logic value;

an output terminal of the first XOR gate is connected to an input terminal of the second NOT gate and a first data input terminal of the first AND gate;

an output terminal of the second XOR gate is connected to an input terminal of the third NOT gate and a second data input terminal of the first AND gate;

an output terminal of the second NOT gate is connected to a first data input terminal of the second AND gate, and an output terminal of the third NOT gate is connected to a second data input terminal of the second AND gate; and an output terminal of the first AND gate is configured to output the first sub-control signal, and an output terminal of the second AND gate is configured to output the second sub-control signal.

7. The measuring device according to claim 2, wherein the digital voltage controlled oscillator comprises a time-average-frequency direct period synthesis frequency synthesizer, the time-average-frequency direct period synthesis frequency synthesizer is configured to generate a first period and a second period according to a base time unit and an input frequency control word that is received and generate a clock signal in an interleaved manner by using the first period and the second period, the base time unit is a phase difference between any two adjacent signals of two or more signals with phases evenly spaced, and the clock signal that is generated is represented by an equation of:

$$T_{TAF}=(1-r)*T_A+r*T_B,$$

wherein $T_{TAF}$ is a period of the clock signal that is generated, $T_A$ is the first period, $T_B$ is the second period, r is a number that controls an occurrence probability of the first period and an occurrence probability of the second period, and 0≤r<1.

8. The measuring device according to claim 7, wherein a relationship between the frequency control word output by the digital voltage controlled oscillator and the oscillation frequency of the signal output by the oscillation circuit satisfies an equation of:

$$f_i = \frac{f_\Delta}{N \cdot FREQ},$$

wherein $f_\Delta$ is a reciprocal of the base time unit of the digital voltage controlled oscillator, FREQ is the frequency control word output by the digital voltage controlled oscillator, N is the frequency division ratio of the frequency divider, and $f_i$ is the oscillation frequency of the signal output by the oscillation circuit.

9. The measuring device according to claim 1, wherein the element to be measured is a variable resistor, and the digital signal processing circuit is configured to obtain a resistance value of the variable resistor according to the frequency control word that is read by the digital signal processing circuit.

10. The measuring device according to claim 9, wherein the oscillation circuit is an RC oscillation circuit, a relationship between the resistance value of the variable resistor and the frequency control word read by the digital signal processing circuit satisfies an equation of:

$$R = \frac{N \cdot FREQ}{2\pi C f_\Delta},$$

wherein $f_\Delta$ is a reciprocal of a base time unit of a digital voltage controlled oscillator in the time average frequency-frequency lock loop, N is a frequency division ratio of a frequency divider in the time average frequency-frequency lock loop, FREQ is the frequency control word read by the digital signal processing circuit, R is the resistance value of the variable resistor, and C is a capacitance value of a capacitor in the RC oscillation circuit.

11. The measuring device according to claim 9, wherein the variable resistor is a thermistor, and the digital signal processing circuit is configured to obtain an ambient temperature of an environment at which the thermistor is located according to the frequency control word that is read by the digital signal processing circuit.

12. The measuring device according to claim 11, wherein the oscillation circuit is an RC oscillation circuit, and the thermistor is a negative temperature coefficient thermistor, a relationship between the ambient temperature of the environment at which the thermistor is located and the frequency control word read by the digital signal processing circuit satisfies an equation of:

$$T = \frac{\ln(k \cdot FREQ/R_0)}{B} + \frac{1}{T_0},$$

wherein $$k = \frac{N}{2\pi C f_\Delta},$$

T is the ambient temperature of the environment at which the thermistor is located, $f_\Delta$ is a reciprocal of a base time unit of a digital voltage controlled oscillator in the time average frequency-frequency lock loop, N is a frequency division ratio of a frequency divider in the time average frequency-frequency lock loop, FREQ is the frequency control word read by the digital signal processing circuit, R is the resistance value of the thermistor, B is a sensitivity index of the thermistor, $T_0$ is an initial temperature, and $R_0$ is an initial resistance value of the thermistor.

13. The measuring device according to claim 1, wherein the element to be measured is a variable capacitor, and the digital signal processing circuit is configured to obtain a capacitance value of the variable capacitor according to the frequency control word that is read by the digital signal processing circuit.

14. The measuring device according to claim 1, wherein the element to be measured is a variable inductor, and the digital signal processing circuit is configured to obtain an inductance value of the variable inductor according to the frequency control word that is read by the digital signal processing circuit.

15. The measuring device according to claim 1, wherein the time average frequency-frequency lock loop and the digital signal processing circuit are arranged in a same chip.

16. A measuring method, comprising:
causing an oscillation circuit to output a signal having an oscillation frequency correlated with an element value of an element to be measured;

receiving, by a time average frequency-frequency lock loop, the signal output by the oscillation circuit, and outputting a frequency control word correlated with the oscillation frequency;

reading, by a digital signal processing circuit, the frequency control word output by the time average frequency-frequency lock loop, and obtaining the element value of the element to be measured according to the frequency control word output by the time average frequency-frequency lock loop.

17. The measuring method according to claim 16, wherein the element to be measured is a variable resistor, and the measuring method comprises obtaining a resistance value of the variable resistor according to the frequency control word that is read by the digital signal processing circuit.

18. The measuring method according to claim 17, wherein the variable resistor is a thermistor, and the measuring method further comprises:

obtaining, by the digital signal processing circuit, an ambient temperature of an environment at which the thermistor is located according to the frequency control word that is read by the digital signal processing circuit.

19. The measuring method according to claim 16, wherein the element to be measured is a variable capacitor, and the measuring method comprises obtaining a capacitance value of the variable capacitor according to the frequency control word that is read by the digital signal processing circuit.

20. The measuring method according to claim 16, wherein the element to be measured is a variable inductor, and the measuring method comprises obtaining an inductance value of the variable inductor according to the frequency control word that is read by the digital signal processing circuit.

* * * * *